United States Patent
Tanzawa

(10) Patent No.: US 8,026,702 B2
(45) Date of Patent: Sep. 27, 2011

(54) VOLTAGE REGULATOR SYSTEM

(75) Inventor: Toru Tanzawa, Tokyo (JP)

(73) Assignee: Micron Technology, Inc., Boise, ID (US)

(*) Notice: Subject to any disclaimer, the term of this patent is extended or adjusted under 35 U.S.C. 154(b) by 471 days.

(21) Appl. No.: 12/200,457

(22) Filed: Aug. 28, 2008

(65) Prior Publication Data

US 2009/0302815 A1 Dec. 10, 2009

(30) Foreign Application Priority Data

Jun. 10, 2008 (JP) ................................ 2008-151491

(51) Int. Cl.
*G05F 1/577* (2006.01)

(52) U.S. Cl. ........................................ 323/267; 323/314

(58) Field of Classification Search .......... 323/266–268, 323/311–316, 272; 327/77, 96, 137, 143, 327/315, 415, 384; 324/76.15, 76.35, 76.24; 365/226, 229

See application file for complete search history.

(56) References Cited

U.S. PATENT DOCUMENTS

| | | | |
|---|---|---|---|
| 5,512,814 A | 4/1996 | Allman | |
| 5,546,042 A | 8/1996 | Tedrow et al. | |
| 6,140,805 A | 10/2000 | Kaneko et al. | |
| 6,979,983 B2 | 12/2005 | Yen et al. | |
| 7,176,751 B2 | 2/2007 | Giduturi et al. | |
| 2007/0177442 A1 | 8/2007 | Tomishima | |

FOREIGN PATENT DOCUMENTS

| | | |
|---|---|---|
| JP | 50-078942 | 7/1975 |
| JP | 57-086917 | 5/1982 |
| JP | 62-122488 | 8/1987 |
| JP | 63-115213 | 5/1988 |
| JP | 2000-039926 | 2/2000 |
| JP | 2000-081920 | 3/2000 |
| JP | 2006-139405 | 6/2006 |

OTHER PUBLICATIONS

Notice of Rejection (Feb. 16, 2010) (6 pages).
Tanzawa, Toru, et al. "A 44-mm2 Four Bank Eight-Word Page-Read 64-Mb Flash Memory with Flexible Block Redundancy and Fast Accurate Word-Line Voltage Controller," IEEE Journal of Solid State Circuits, vol. 37, No. 11 (Nov. 2002), pp. 1485-1492.

*Primary Examiner* — Rajnikant B Patel
(74) *Attorney, Agent, or Firm* — Brooks, Cameron & Huebsch, PLLC

(57) ABSTRACT

The present disclosure includes circuits, systems and methods for regulating voltage. One voltage regulator system embodiment includes a voltage regulator having an output and a number of stages coupled in parallel to the output of the voltage regulator. Each stage includes a source follower circuit, and a sample and hold circuit coupled in series between the output of the voltage regulator and an input of the source follower circuit.

22 Claims, 13 Drawing Sheets

VOLTAGE REGULATOR SYSTEM

CROSS-REFERENCE TO RELATED APPLICATIONS

The application claims priority to Japanese Patent Application No. 2008-151491, filed Jun. 10, 2008, which is incorporated herein by reference.

TECHNICAL FIELD

The invention relates to semiconductors and semiconductor memory devices. More particularly, in one or more embodiments the invention relates to a voltage regulator system for a memory device.

BACKGROUND

Memory devices are typically provided as internal, semiconductor, integrated circuits in computers or other electronic devices. There are many different types of memory utilized in memory devices, including random-access memory (RAM), read only memory (ROM), dynamic random access memory (DRAM), synchronous dynamic random access memory (SDRAM), phase change RAM (PCRAM) and flash memory, among others.

Memory devices are utilized as non-volatile memory for a wide range of electronic applications. Flash, and other, memory devices typically use a one-transistor memory cell that allows for high memory densities, high reliability, and low power consumption.

Uses for memory include memory for personal computers, personal digital assistants (PDAs), digital cameras, and cellular telephones, among others. Program code and system data, such as a basic input/output system (BIOS), are typically stored in flash memory devices. This information can be used in personal computer systems, and other electronic devices.

Two common types of memory array architectures, e.g., flash memory array architecture, are the "NAND" and "NOR" architectures, so called for the logical form in which the basic memory cell configuration of each is arranged.

A NAND array architecture arranges its array of floating gate memory cells in a matrix such that the gates of each floating gate memory cell in a row of the array are coupled to an access line (which is commonly referred to in the art as a "word line"). However each memory cell is not directly coupled to a column data line (which is commonly referred to in the art as a "bit line") by its drain. Instead, the memory cells of the array are coupled together in series, source to drain, between a source line and a column data line. The terms "row" and "column," as used herein, do not necessarily refer to a particular linear relation of the memory cells, but rather generally to an intersection in an arrangement of memory cells.

Memory cells in a NAND array architecture can be programmed to a desired state. That is, electric charge can be placed on or removed from the floating gate of a memory cell to put the cell into a number of stored states. For example, a single level cell (SLC) can represent two states, e.g., 1 or 0.

Memory cells, e.g., flash memory cells, can also be programmed to more than two states, such as to a number of states that allows a cell to represent more than two binary digits, e.g., 1111, 0111, 0011, 1011, 1001, 0001, 0101, 1101, 1100, 0100, 0000, 1000, 1010, 0010, 0110, and 1110. Such cells may be referred to as multi state memory cells, multi-digit cells, or multilevel cells (MLCs). MLCs can allow the manufacture of higher density memories without increasing the number of memory cells since each cell can represent more than one binary digit, e.g., more than one bit. MLCs can have more than two programmed states, e.g., a cell capable of representing four digits can have sixteen programmed states. Some MLCs may have an erased state and a number of programmed states, each of which can represent a bit pattern. For these MLCs, the lowermost program state is not programmed above the erased state, that is, if the cell is programmed to the lowermost state, it remains in the erased state rather than having a charge applied to the cell during a programming operation. The other states can be referred to as "non-erased" states.

One or more voltage levels are utilized in operating memory cells, particularly in operating MLCs. Due to the variety of programmable states of each cell, voltages of several magnitudes may be used during operation of MLCs, e.g., programming and/or read. Increasing the quantity of different voltage levels used, can increase the circuit complexity and losses associated with producing many different voltage levels, e.g., energy usage, heat generated, etc.

DETAILED DESCRIPTION

The present disclosure includes circuits, systems and methods for regulating voltage. One voltage regulator system embodiment includes a voltage regulator having an output and a number of stages coupled in parallel to the output of the voltage regulator. Each stage includes a source follower circuit, and a sample and hold circuit coupled in series between the output of the voltage regulator and an input of the source follower circuit.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

Figure 1:
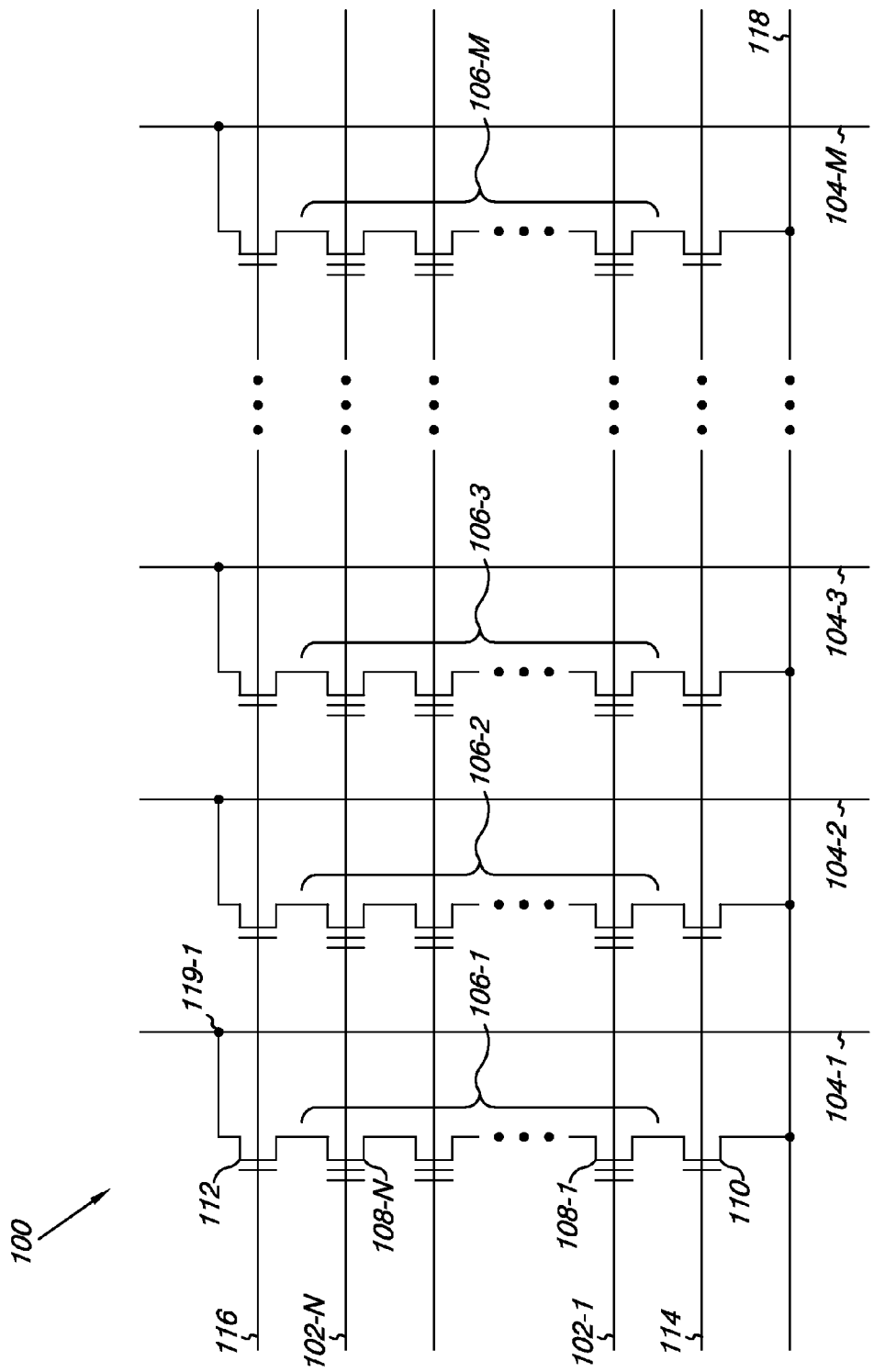
FIG. 1 is a schematic of a portion of a non-volatile memory array, in accordance with one or more embodiments of the present disclosure.

FIG. 1 is a schematic of a portion of a non-volatile memory array 100. The embodiment of FIG. 1 illustrates a NAND architecture non-volatile memory. However, embodiments described herein are not limited to this example. As shown in FIG. 1, the memory array 100 includes access lines 102-1, ..., 102-N, e.g., word lines (WL), and intersecting data lines 104-1, ..., 104-M, e.g., bit lines (BL). For ease of addressing in the digital environment, the number of word lines 102-1, ..., 102-N and the number of bit lines 104-1, ..., 104-M are typically each some power of two, e.g., 256 word lines by 4,096 bit lines.

Memory array 100 includes NAND strings 106-1, ..., 106-M. Each NAND string includes non-volatile memory cells 108-1, ..., 108-N, each located at an intersection of a word line, e.g., 102-1, ..., 102-N, and a local bit line, e.g., 104-1, ..., 104-M. The non-volatile memory cells 108-1, ..., 108-N of each NAND string 106-1, ..., 106-M are connected in series source to drain between a source access gate source, e.g., a field-effect transistor (FET) 110, and a drain access gate drain, e.g., FET 112. Source access gate 110 is located at the intersection of a local bit line 104-1 and a source access line 114. The drain access gate 112 is located at the intersection of the local bit line 104-1 and a drain access line 116.

As shown in the embodiment illustrated in FIG. 1, a source of source access gate 110 is connected to a common source line 118. The drain of source access gate 110 is connected to the source of the memory cell 108-1 of the corresponding NAND string 106-1. The drain of drain access gate 112 is connected to the local bit line 104-1 for the corresponding NAND string 106-1 at drain contact 119-1. The source of drain access gate 112 is connected to the drain of the last memory cell 108-N, e.g., a floating-gate transistor, of the corresponding NAND string 106-1.

In one or more embodiments, construction of non-volatile memory cells, 108-1, ..., 108-N, includes a source, a drain, a floating gate or other charge storage node, and a control gate. Non-volatile memory cells, 108-1, ..., 108-N, have their control gates coupled to a word line, 102-1, ..., 102-N respectively. A column of the non-volatile memory cells, 108-1, ..., 108-N, make up the NAND strings, e.g., 106-1, ..., 106-M, those memory cells being commonly coupled to a given local bit line, e.g., 104-1, ..., 104-M respectively. A row of the non-volatile memory cells are those memory cells commonly coupled to a given word line, e.g., 102-1, ..., 102-N. A NOR array architecture would be similarly laid out except that the string of memory cells would be coupled in parallel between the access gates.

As one of ordinary skill in the art will appreciate, subsets of cells coupled to a selected word line, e.g., 102-1, ..., 102-N, can be programmed and/or sensed together as a group. A programming operation, e.g., a write operation, can include applying a number of program pulses, e.g., 16V-20V, to a selected access line in order to increase the threshold voltage (Vt) of selected cells to a desired program voltage level corresponding to a desired program state.

A sensing operation, such as a read or program verify operation, can include sensing a voltage and/or current change of a data line coupled to a selected cell in order to determine the state of the selected cell. The sensing operation can involve biasing a data line, e.g., bit line 104-1, associated with a selected memory cell at a voltage above a bias voltage for a source line, e.g., source line 118, associated with the selected memory cell. A sensing operation could alternatively include pre-charging the bit line 104-1 followed with discharge when a selected cell begins to conduct, and sensing the discharge.

Sensing the state of a selected cell can include applying a sensing voltage to a selected access line, while biasing the unselected cells of the string at a voltage sufficient to place the unselected cells in a conducting state independent of the threshold voltage of the unselected cells. The data line corresponding to the selected cell being read and/or verified can be sensed to determine whether or not the selected cell conducts in response to the particular sensing voltage applied to the selected access line. For example, the state of a selected cell can be determined by the access line voltage at which the data line current reaches a predetermined reference current associated with a particular state.

As one of ordinary skill in the art will appreciate, in a sensing operation performed on a selected memory cell in a NAND string, the unselected memory cells of the string are biased so as to be in a conducting state. In such a sensing operation, the data stored in the selected cell can be based on the current and/or voltage sensed on the bit line corresponding to the string. For instance, the interpreted value of data stored in the selected cell can be based on whether the bit line current changes by a predetermined amount or reaches a predetermined level in a given time period.

When the selected cell is in a conductive state, current flows between a source line contact at one end of the string, and a bit line contact at the other end of the string. As such, the current associated with sensing the selected cell is carried through each of the other cells in the string, the diffused regions between cell stacks, and the access transistors.

Figure 2:
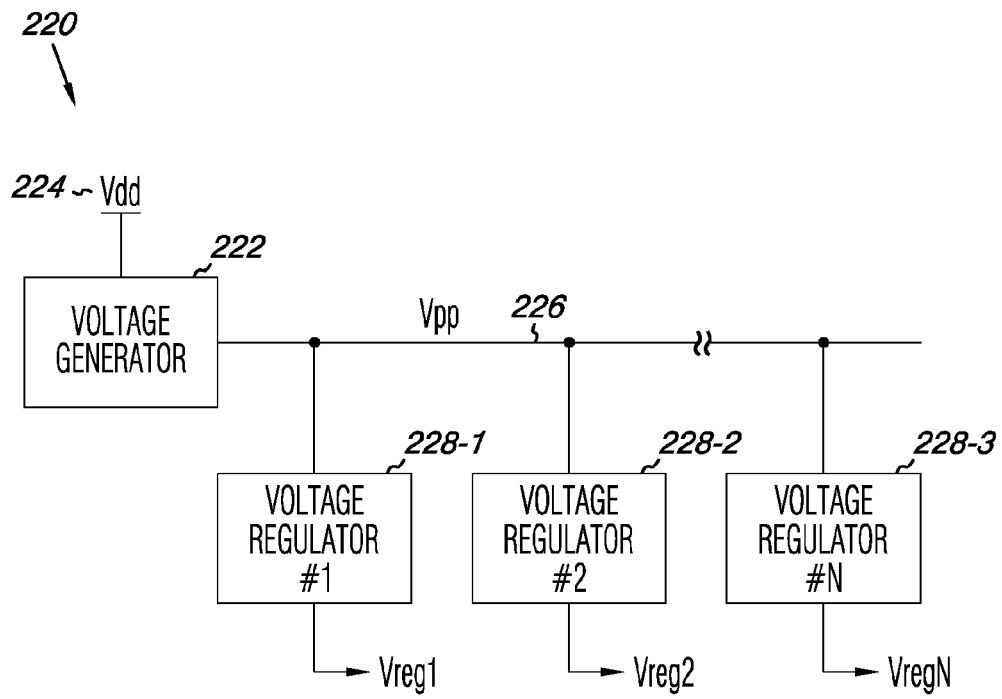
FIG. 2 is a block diagram of a voltage system in accordance with one or more embodiments of the present disclosure.

FIG. 2 is a block diagram of a voltage system in accordance with one or more embodiments of the present disclosure. FIG.

2 illustrates a voltage system 220. A voltage generator 222 is coupled to a supply voltage source (Vdd) 224, and to a programming voltage (Vpp) bus 226. The voltage generator 222 transforms a supply voltage (Vdd), received from the supply voltage source 224, and provides a programming voltage (Vpp) to the programming voltage bus 226. The programming voltage (Vpp) is further operated on by voltage regulators, e.g., voltage regulator #1 (228-1), voltage regulator #2 (228-2), . . . voltage regulator #N (228-N), to produce a number of regulated voltages, e.g., Vreg1, Vreg2, . . . VregN, respectively.

The programming voltage (Vpp) may be of a larger magnitude than the supply voltage (Vdd). Thus voltage generator 222 may include one or more voltage charge pumps, for example. Then, the voltage regulators, e.g., 228-1, 228-2, . . . , 228-N, may regulate up or down from the programming voltage (Vpp) to produce the regulated voltages, e.g., Vreg1, Vreg2, . . . , VregN. Typically, regulated voltages, e.g., Vreg1, Vreg2, . . . , VregN, are of different magnitudes from one another; however, embodiments of the present invention are not so limited. There are many semiconductor devices, e.g., flash memory, which use multiple regulated voltages that may be of larger magnitude than the supply voltage, e.g., Vdd.

Figure 3:
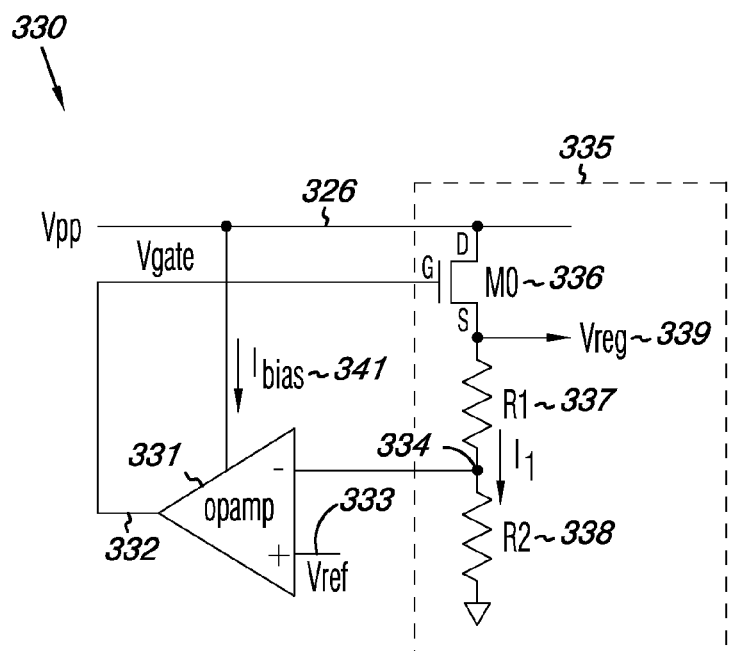
FIG. 3 is a circuit diagram of a voltage regulator in accordance with one or more embodiments of the present disclosure.

FIG. 3 is a circuit diagram of a voltage regulator in accordance with one or more embodiments of the present disclosure. In the embodiment illustrated in FIG. 3, the voltage regulator 330 is an example of a voltage regulator that can be used in a voltage system, e.g., voltage regulators 228-1, 228-2, . . . , 228-N shown in FIG. 2. The circuit of the voltage regulator 330 illustrated in FIG. 3 includes a comparator 331, e.g., an operational amplifier (opamp), coupled to an n-channel source follower circuit 335. The n-channel source follower circuit 335 includes an N-channel MOS transistor (M0) 336, a first resistive element (R1) 337, and a second resistive element (R2) 338. The N-channel MOS transistor (M0) 336, first resistive element (R1) 337, and second resistive element (R2) 338 are connected in series between a first voltage, e.g., a source potential such as Vpp, and a second voltage, e.g., ground, Vss, or some other point of common potential. First resistive element (R1) 337 and second resistive element (R2) 338 form a voltage divider network. As shown in FIG. 3, the drain (D) of the N-channel MOS transistor (M0) 336 is connected to programming voltage (Vpp) bus 326, and the source (S) of the N-channel MOS transistor (M0) 336 is connected to the first resistive element (R1) 337.

One input terminal of comparator 331, e.g., a non-inverting terminal (+), is connected to a reference voltage 333, and the other input terminal of comparator 331, e.g., a inverting terminal (−), is connected to a node 334 between the first resistive element (R1) 337, and the second resistive element (R2) 338, so as to receive a feedback voltage signal derived from the voltage divider network formed by the first resistive element (R1) 337 and the second resistive element (R2) 338.

The output 332 of comparator 331 is connected to the gate (G) of the N-channel MOS transistor (M0) 336, and the signal present thereon is Vgate. A regulated voltage output terminal (Vreg) 339 of the voltage regulator 330 is shown located between the source (S) of the N-channel MOS transistor (M0) 336 and the first resistive element (R1) 337. As one skilled in the art will appreciate, the feedback voltage signal presented to the inverting terminal of comparator 331, is proportional to the regulated voltage, e.g., Vreg. Thus, comparator 331 provides an output differential signal, e.g., an "error" signal, representative of the reference voltage 333 with respect to the regulated voltage 339. The N-channel MOS transistor (M0) 336 drives the voltage divider network, e.g., first (R1) 337 and second (R2) 338 resistive elements, based on the output differential signal applied to the gate.

The voltage regulator 330 draws power from the source potential, e.g., Vpp, by two paths. First, because it is an amplifier, comparator 331 draws a bias current, e.g., Ibias 341. Another current, e.g., I1, also flows through the N-channel MOS transistor (M0) 336 and the voltage divider network formed by the first resistive element (R1) 337 and the second resistive element (R2) 338.

The voltage divider network, e.g., R1 (337) and R2 (338), develops a feedback voltage at node 334 that is proportional to the regulated voltage, e.g., Vreg. The feedback voltage at node 334 is compared to the reference voltage, e.g., Vref 333 by comparator 331. As Vref increases with respect to the feedback voltage at node 334 (which is proportional to the present value of Vreg), Vgate will increase, thus causing more current, e.g., I1, to flow through the N-channel MOS transistor (M0) 336. The increased current, e.g., I1, also flows through the voltage divider network, e.g., R1 (337) and R2 (338), causing the output voltage, e.g., Vreg, to also increase since Vreg is equal to the product of the resistance of the voltage divider network and the current passing through the voltage divider network:

$$Vreg = I1(R1+R2)$$

The circuit shown in FIG. 3 is arranged such that comparator 331 operates to drive the N-channel MOS transistor (M0) 336 to minimize the "error" signal, in other words, to drive the feedback voltage at node 334, between the first resistive element (R1) 337 and the second resistive element (R2) 338, to the reference voltage level, e.g., Vref 333. Thus:

$$I1 = Vref/R2$$

Substituting for I1 in the equation above:

$$Vreg = Vref \times (R1+R2)/R2$$

Thus, Vreg is some multiplier (greater than 1) of Vref, the multiplier being determined by the values of the resistive elements of the voltage divider network.

The reader will appreciate that the magnitude of Vref may be adjusted in a variety of ways, including by adjusting the magnitude of the reference voltage, e.g., Vref, or by adjusting the voltage at node 334, e.g., by adjusting one or both of the resistive elements R1 and/or R2.

According to one or more embodiments of the present disclosure, and depending on resistance values of the first resistive element (R1) 337 and the second resistive element (R2) 338, example values for Vreg may be in the range of 0-5 volts, or 5-10 volts, among others. Example values for I1 range from approximately 20 microAmps at a relatively large magnitude of Vreg, e.g., 5 or 10 volts, to approximately 5 microAmps at a relatively small magnitude of Vreg e.g., 0 or 5 volts. Comparator 331 typically draws, e.g., Ibias 341, approximately 10 microAmps of current (depending on comparator gain). Example values for R1 may be approximately four times that of R2. While example values are provided above for illustration purposes, embodiments of the present disclosure are not limited to the example values provided.

Voltage regulator 330, illustrated in FIG. 3 and described above, has an N-channel MOS transistor (M0), e.g., 336, arranged such that when the output, e.g., Vgate, of comparator 331 increases, Vreg increases. One skilled in the art will understand that the output, e.g., Vgate, of comparator 331 increases when the feedback voltage at node 334 (which is proportional to Vref) is less than the reference voltage, e.g., Vref 333. However, embodiments of the present disclosure are not limited to the n-channel MOS implementation shown in FIG. 3.

For instance, in one or more embodiments, voltage regulator 330 may be implemented with a source follower circuit, e.g., 335, using a bipolar transistor, JFET, or p-channel MOS transistor, among others. For example, a p-channel MOS transistor (M0) may be used in place of the n-channel MOS transistor (M0) shown in FIG. 3, with the non-inverting input to comparator 331 coupled to node 334, and the inverting input of the comparator 331 coupled to the reference voltage 333. In this p-channel implementation, one skilled in the art will recognize that as the output, e.g., Vgate, of comparator 331 increases, then Vreg will decrease, again driving the circuit towards an equilibrium to minimize the differences, e.g., "error" signal, between Vref and the voltage at node 334.

Furthermore, while the voltage regulator 330 is illustrated in FIG. 3, and described above, as being supplied from a pumped programming voltage, e.g., Vpp, embodiments of the present disclosure are not so limited. For example, one or more embodiments of the voltage regulator 330 may be powered from an un-pumped supply voltage source, e.g., Vdd, or some other voltage level.

Referring again to the parallel voltage regulation system illustrated in FIG. 2, and the voltage regulator illustrated in FIG. 3, the reader will appreciate that as the quantity of parallel voltage regulators increases (each drawing current), the total current dissipation (and power usage) of the aggregation of voltage regulators also increases. The power consumption of the voltage generator, e.g., charge pump circuit(s), that supply the voltage regulators, depends on the output current, including the current drawn by the voltage regulators from the pumped programming voltage source, e.g., Vpp, bus 226 in FIG. 2. Not only does input power to the voltage generator increase, but the number of cascaded charge pumps, e.g., series-connected charge pumps, also increases to provide increased output. Thus, more circuit area is needed to implement a greater quantity of charge pumps.

Response time, e.g., rise time, is another consideration as the number of parallel voltage regulators increases. In order to maintain rise time performance, e.g., approximately 10 microseconds, charge pump capacity is needed to respond to transient conditions. Again, more circuit area is needed to implement a greater quantity of charge pumps to serve a greater number of parallel voltage regulators.

Figure 4:
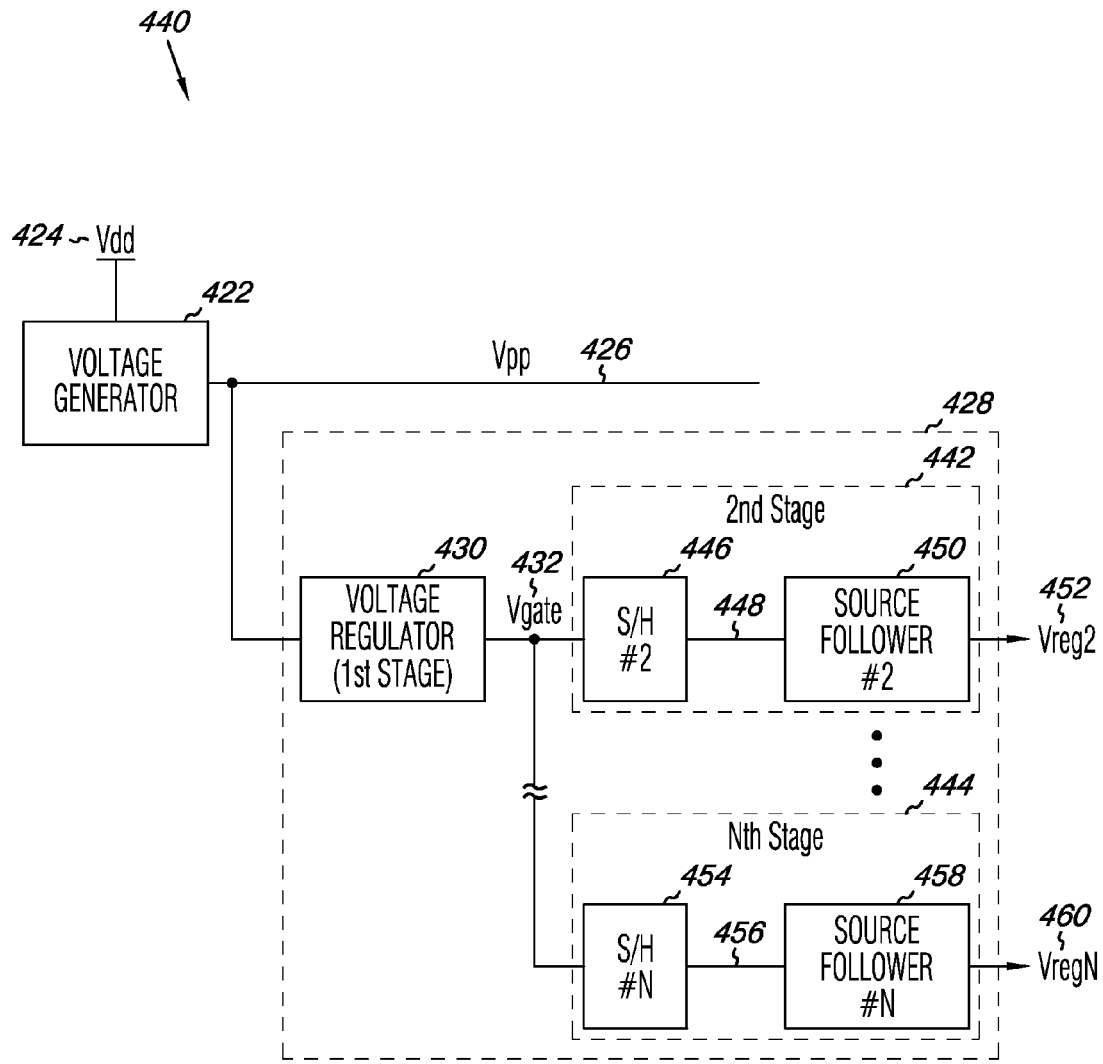
FIG. 4 is a block diagram of a voltage system having a voltage regulator system, including a voltage regulator in series with multiple parallel subsequent stages in accordance with one or more embodiments of the present disclosure.

FIG. 4 is a block diagram of a voltage system having a voltage regulator system, including a voltage regulator in series with multiple parallel subsequent stages in accordance with one or more embodiments of the present disclosure. According to one or more embodiments of the present disclosure, a voltage system 440 is arranged to limit the quantity of current drawn from an upstream voltage generator 422, which may improve performance and reduce circuit footprint. The voltage system 440 includes a voltage generator 422 coupled to a supply voltage source (Vdd) 424. The output of voltage generator 422 is connected to a programming voltage (Vpp) bus 426. The voltage generator 422 transforms a supply voltage (Vdd), received from the supply voltage source 424, and provides a programming voltage (Vpp) to the programming voltage bus 426.

The programming voltage bus 426 is coupled a voltage regulator system 428. Voltage regulator system 428 includes a voltage regulator 430 as a first stage, and a number of subsequent stages, e.g., a second stage 442 through an Nth stage 444, coupled in parallel to the output 432 of the voltage regulator 430 ("first stage" as shown). According to one or more embodiments, the voltage regulator 430 is a voltage regulator configured as voltage regulator 330 shown in FIG. 3, but utilizing the comparator output, e.g., Vgate, as the output of the voltage regulator 430 (rather than Vref, which is not shown in FIG. 4). Thus, the second stage 442 through an Nth stage 444, are connected in parallel to the comparator output, e.g., Vgate, of the voltage regulator 430.

In one or more embodiments, and as illustrated in FIG. 4, each of the subsequent stages, e.g., second stage 442 through Nth stage 444, can include a sample and hold circuit connected in series with a source follower circuit. For instance, the second stage 442 includes sample and hold (S/H #2) 446 connected in series with a source follower circuit 450 at node 448, and the Nth stage 444 includes sample and hold (S/H #N) 454 connected in series with a source follower circuit 458 at node 456. In various embodiments, the output of each source follower is a regulated voltage. For instance, the output of source follower 450 is a regulated voltage 452 (Vreg2), and the output of source follower 458 is a regulated voltage 460 (VregN).

The voltage regulator 430 operates to provide a Vgate to the subsequent stages, e.g., 442 to 444. The sample and hold circuits of the subsequent stages hold a particular value of Vgate as an input to the associated source follower circuit. By varying Vgate and independently controlling each of the subsequent stages to hold a different value of Vgate, each regulated voltage output, e.g., Vreg2, . . . , VregN, can be controlled to a different level. In this manner, multiple regulated voltage outputs may be provided. And as will be detailed further below, the current drawn from the voltage generator 422 may be limited by the methods and circuits of the present disclosure.

Figure 5:
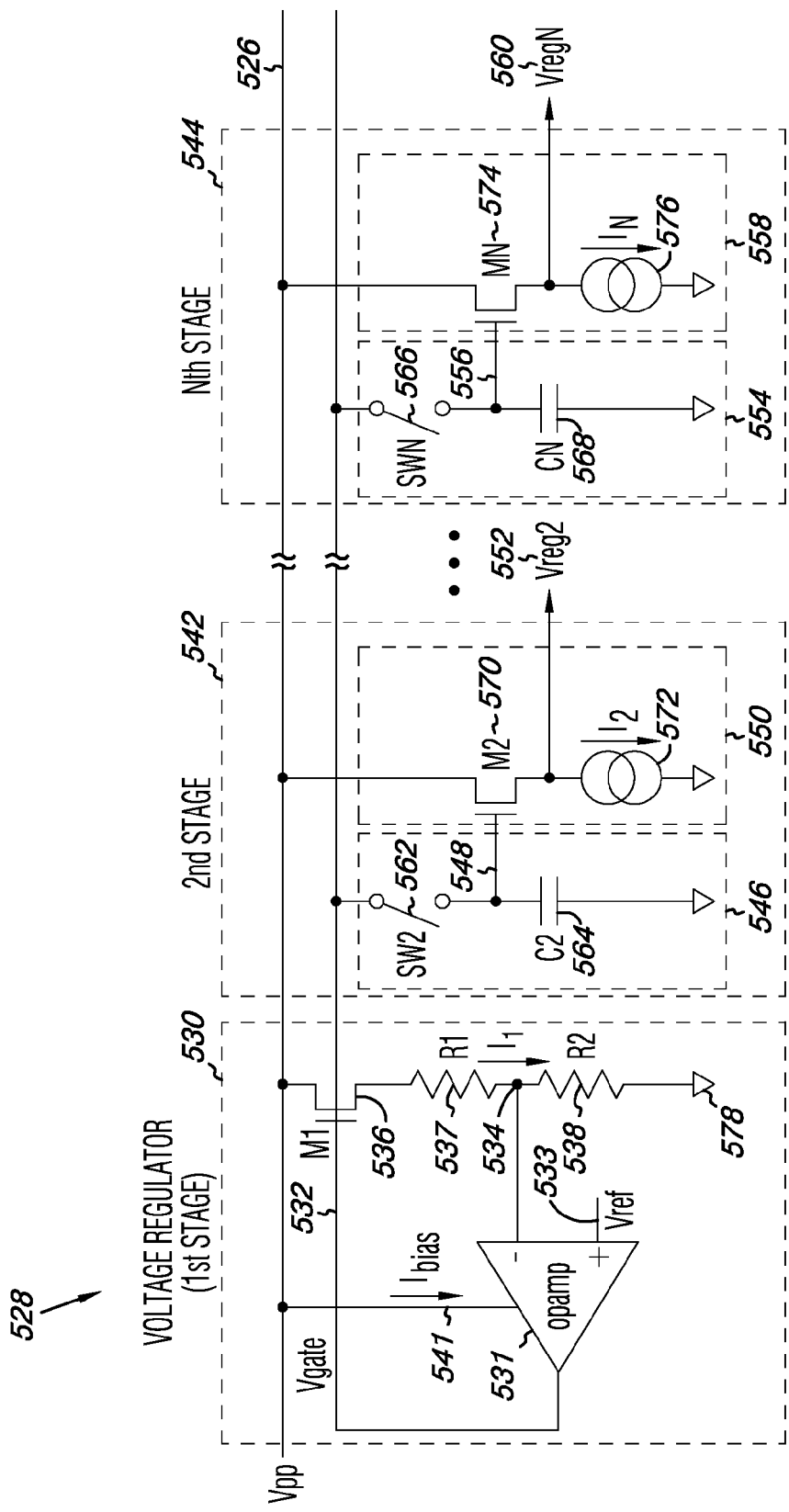
FIG. 5 is a circuit diagram of a voltage regulator system having a voltage regulator in series with multiple parallel subsequent stages in accordance with one or more embodiments of the present disclosure.

FIG. 5 is a circuit diagram of a voltage regulator system having a voltage regulator in series with multiple parallel subsequent stages in accordance with one or more embodiments of the present disclosure. To facilitate illustration of detail, FIG. 5 omits showing a voltage generator coupled to a supply voltage source, e.g., Vdd, to provide a voltage to the pumped programming voltage (Vpp) bus 526.

Voltage regulator system 528 is coupled to the programming voltage (Vpp) bus 526, as shown. Voltage regulator system 528 includes a voltage regulator 530 as a first stage, and a number of subsequent stages, e.g., a second stage 542 through an Nth stage 544. The subsequent stages are coupled in parallel to the output 532 of the comparator 531. In the embodiment illustrated in FIG. 5, the output of the first stage, e.g., voltage regulator 530, is the output 532 of comparator 531 (Vgate).

According to one or more embodiments, the voltage regulator 530 may be a voltage regulator such as voltage regulator 330 shown in FIG. 3, but utilizing the comparator output 532 (Vgate) as the output of the first stage, e.g., voltage regulator 530, rather than the regulated output (Vref, as shown for the voltage regulator illustrated in FIG. 3). Thus, the second stage 542 through an Nth stage 544, are connected in parallel to the comparator output 532, e.g., Vgate, of the voltage regulator 530. Configuration and operation of the voltage regulator 530 are as described for the circuit shown in FIG. 3, and will not be repeated here (5xx series reference numbers used in conjunction with FIG. 5 correspond to the 3xx series reference numbers having similar last two digits used in conjunction with FIG. 3).

In one or more embodiments, and as illustrated in FIG. 5, each of the subsequent stages, e.g., second stage 542 through Nth stage 544, can include a sample and hold circuit connected in series with an associated source follower circuit. For instance, the second stage 542 includes sample and hold circuit 546 connected in series with associated source follower circuit 550 at node 548, and the Nth stage 544 includes sample and hold circuit 554 connected in series with associated source follower circuit 558 at node 556. In various embodiments, the output of each source follower is a regulated voltage. For instance, the output of source follower 550 is a regulated voltage 552 (Vreg2), and the output of source follower 558 is a regulated voltage 560 (VregN).

According to one or more embodiments, each sample and hold circuit includes a switch, e.g., switch 2 (SW2) 562 and switch N (SWN) 566, connected in series between the output 532 of comparator 531 (Vgate) and a capacitor, e.g., 564 in the second stage and 568 in the Nth stage. The other terminal of each capacitor is connected to a common potential, e.g., signal ground.

The following uses the second stage 542 as an example in describing the operation of the subsequent stages, e.g., second stage 542 and Nth stage 544. Other subsequent stages operate similarly. One skilled in the art will understand that capacitor 2 (C2) 564 is coupled to the output 532 of comparator 531, and charges to the level of Vgate through switch 2 (SW2) 562. At a particular value of Vgate, switch 2 (SW2) 562 may open leaving capacitor 2 (C2) charged to the particular value of Vgate. The capacitors of other subsequent stages, e.g., capacitor N (CN) 568 of the Nth stage, are also being charged to the level of Vgate; however, the associated switch of the respective stage may open at a different level of Vgate, thus holding a different magnitude voltage on the associated capacitor. The sample and hold capacitors are sized to store the Vgate level for the time the associated regulated voltage output is needed in a particular application.

The source follower circuit of each subsequent stage, e.g., 550 and 558 shown in FIG. 5, include an n-channel MOS transistor, e.g., M2 (570) in the second stage and MN (574) in the Nth stage, coupled in series with a current source, e.g., current source 572 in the second stage and current source 576 in the Nth stage, between the programming voltage (Vpp) bus 526 and a common potential, e.g., signal ground. The current source may be, for example, a resistive network through which a current, e.g., I2 in the second stage and IN in the Nth stage, flows.

The voltage level held in the capacitor of the corresponding sample and hold circuit of each stage is applied to the gate of the source follower transistor, which maintains an operating point of the source follower. One skilled in the art will appreciate that biasing the gates of the source follower transistor at different magnitudes of Vgate, will cause different operating points, and (depending on the current source configuration, e.g., resistance value, will result in a different regulated voltage output for each stage, e.g., (Vreg2) 552 for the second stage, . . . , (VregN) 560 for the Nth stage.

One skilled in the art will appreciate that the current drawn from Vpp in the subsequent stages, e.g., second stage 542, . . . , Nth stage 544, may be significantly less than the current drawn from Vpp in the voltage regulator 530. The current load through the source follower of each subsequent stage may be as low as 5 microAmps, for example, by proper design of the current source impedance. Thus, for a voltage regulator system 528 with 2 subsequent stages (to provide 2 regulated voltages), the current draw for the voltage regulator 530 plus the 2 subsequent stages is:

30 microAmps+(5 microAmps×2 stages)=40 microAmps

Whereas, if 2 voltage regulators, e.g., 530, were connected in parallel to a voltage generator to produce the same 2 regulate voltage outputs, the current draw would be:

30 microAmps×2 stages=60 microAmps

The reader can appreciate that a significant amount of current draw from the upstream voltage generator may be avoided according to embodiments of the present invention, 33% savings in the example provided above.

The current dissipation savings are even greater for applications using even more regulated voltages. For example, a voltage regulator system 528 with 10 subsequent stages (to provide 10 regulated voltages), the current draw for the voltage regulator 530, e.g., first stage, plus the 10 subsequent stages is:

30 microAmps+(5 microAmps×10 stages)=80 microAmps

Likewise, if 10 voltage regulators were connected in parallel to a voltage generator to produce the same 10 regulate voltage outputs, e.g., as shown in FIG. 2, the current draw would be:

30 microAmps×10 stages=300 microAmps

For the case of 10 regulated voltages, the current savings is approximately 73%. One skilled in the art can appreciate that for configurations having more than one regulated voltage, e.g., more than one subsequent stage, the disclosed approach to providing regulated voltages has a benefit of lower current dissipation.

According to one or more embodiments, Vgate may be varied by varying the reference voltage signal, e.g., Vref, presented to one input terminal of the comparator 533. For example, Vref may be ramped from a first voltage magnitude to a second voltage magnitude, e.g., 0 to 1 volts, or 1 to 2 volts, etc. The switches of the sample and hold circuit of each subsequent stage may be respectively controlled to open at a particular value of Vgate. This may be implemented by sensing the level of Vgate, or Vref (knowing a particular value of Vref will produce a corresponding value of Vgate). Rather than operating by detecting a particular value of Vgate, respective switches may be programmed to operate based on an elapsed time after some event. For example, if the starting voltage and ramp rate of Vref is known, the magnitude of Vref at a particular time may be determined. Thus, sample and hold switches may be operated based on time in conjunction with beginning of the ramping of the Vref signal.

The above description includes operating the switches of sample and hold circuits for respective stages at different magnitudes of Vgate, Vref, or at different times, in order to produce different regulated voltage outputs, e.g., (Vreg2) 552, . . . , (VregN) 560, etc. However, embodiments of the present disclosure are not so limited, and one skilled in the art will appreciate that the regulated voltage of a respective stage may be determined, in part, by the characteristics of the current source and/or source follower transistor. Thus, switches of two subsequent stages may be opened at the same time, holding the same value of Vgate in the respective capacitor, with differences in regulated voltage output being determined by different source follower circuit characteristics. For example, the impedance of the respective current sources may be different, or the transistor operating characteristics may be different.

The source follower transistor, e.g., (M2) 570, . . . , (MN) 574, are shown being an n-channel MOS transistor, but embodiments of the present invention are not so limited. The source follower circuits may be configured using different transistor types, e.g., p-channel MOS, JFET, bipolar junction transistors, etc. Furthermore, each subsequent stage need not be configured alike. For example, one subsequent stage may utilize an n-channel MOS source follower transistor, and another subsequent stage may utilize a p-channel MOS source follower transistor, etc.

Comparator 531 drives the gates of a plurality of subsequent stage transistors (in addition to the source follower transistor (M1) 536). In turn, it will be understood that the source follower circuit of the subsequent stages power, or drive, logic circuits constructed on the semiconductor device which includes the voltage regulator circuit. There is no feedback of the regulated voltages supplied by the subsequent stages, thus the regulated voltage may vary as the load, or load current, varies. Thus, the source follower transistors for each subsequent stage should be selected to keep regulated voltage variation to a minimum even without feedback.

Although only two subsequent stages are shown in FIG. 5, it is to be understood that N may represent any number of subsequent stages that may be driven by the voltage regulator 530. The actual number may vary depending on design considerations, such as total current to the downstream logic circuits, e.g., memory arrays, among various other design configurations. Embodiments of the present invention contemplate one or more subsequent stages providing the same regulated voltage as required. For example, two subsequent stages providing the same regulated voltage output, e.g., Vreg2, may be required to meet the current demands for a given regulated voltage level.

Figure 6A:
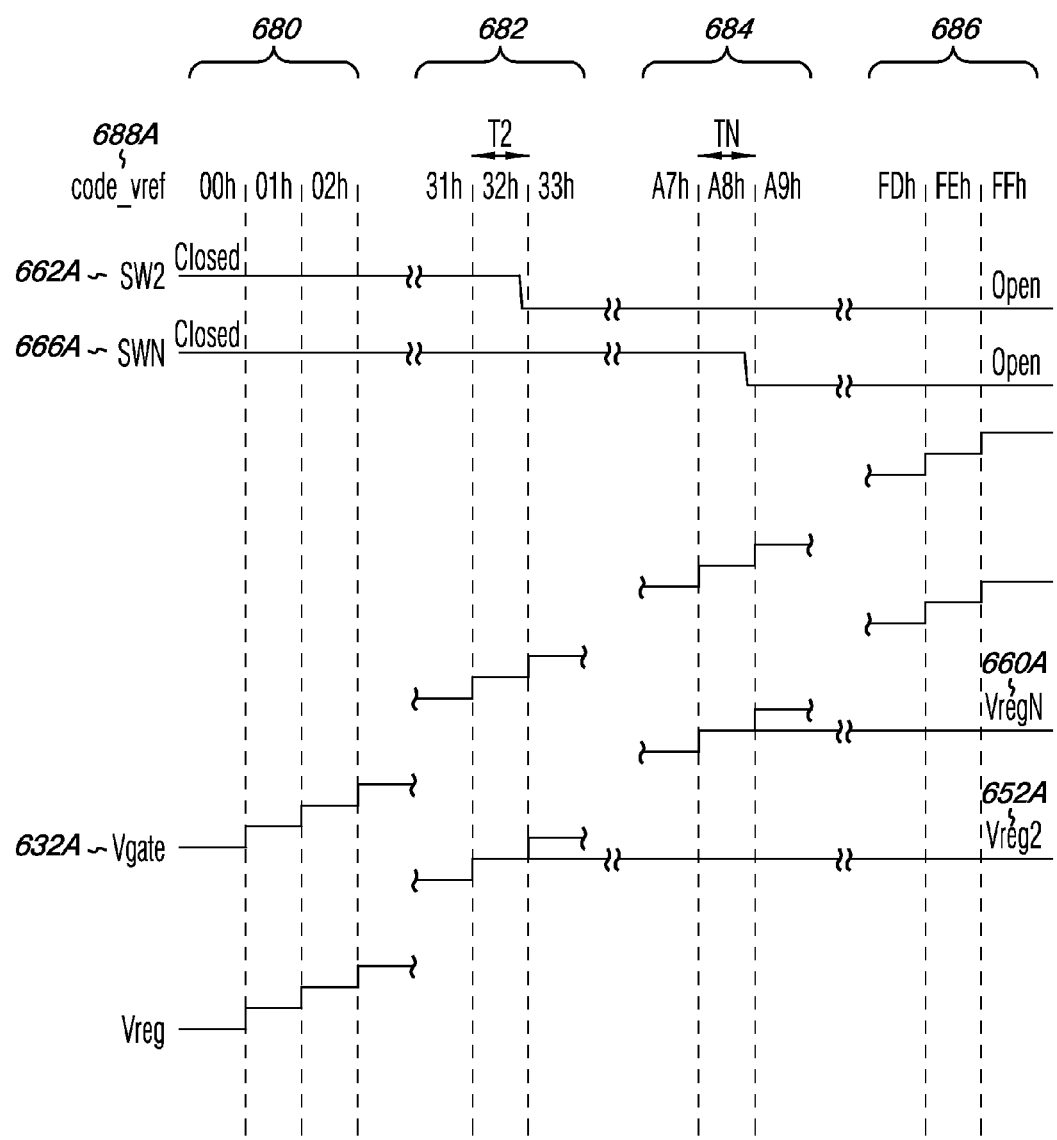
FIG. 6A shows timing waveforms associated with a voltage regulator system operated in a first mode in accordance with one or more embodiments of the present disclosure.

FIG. 6A shows timing waveforms associated with a voltage regulator system operated in a first mode in accordance with one or more embodiments of the present disclosure. The timing waveforms can be associated with the voltage regulator system described in FIGS. 4 and 5. According to one or more embodiments of the present disclosure, an analog Vref signal, e.g., one input signal 533 to comparator 531 in FIG. 5, is generated by a digital-to-analog converter (DAC) receiving a digital value. For example, the DAC may have a certain number (Q) of defined voltage steps (Vstep). Thus:

$$Vref = Vstep \times Q$$

where Q is input to the DAC as a hexadecimal code, e.g., code_vref 688A as shown in FIG. 6A.

Thus, code_vref 688A may be communicated to the DAC and to the switches of the subsequent stages. As code_vref 688A is swept from 00 hex to FF hex, for example, several sequences of code_vref 688A are illustrated in FIG. 6A. For example, in the embodiment illustrated in FIG. 6A, sequence 680 includes code_vref 688A values from 00h to 02h, sequence 682 includes code_vref 688A values from 31h to 33h, sequence 684 includes code_vref 688A values from A7h to A9h, and sequence 686 includes code_vref 688A values from FDh to FFh. As code_vref 688A is swept through the series of hex codes from low to high, Vref (not shown in FIG. 6A) output from the DAC, and Vgate (shown in FIG. 6A) output from comparator 531 in FIG. 5, are correspondingly stepped through a range of discrete levels from low to high, as shown.

In one or more embodiments, the switches of the sample and hold circuits of the respective subsequent stages may be configured to close prior to, or at the beginning of, the progression of code_vref 688A values. Furthermore, the switches of the sample and hold circuits of the respective subsequent stages may be configured to open upon a specific code_vref 688A value (as will be discussed further below). To illustrate this operation further, consider sequences 682 and 684 as applied to the voltage regulator shown in FIG. 5 (assuming source follower circuits are similarly configured).

At a code_vref 688A value of 31h, switch 2 (SW2) and switch N (SWN) remain closed. Vref and Vgate have stepped-up to some value, which corresponds to a particular value of Vreg. Since the sample and hold switches are closed, Vgate is being applied in parallel to all source follower circuit, and the regulated voltage outputs are all providing the same stepped level output, Vreg. Each value of code_vref 688A is held for a given time, e.g., T2, . . . , TN, based on the size of the steps and time constant of the voltage regulator circuit such that the connected sample and hold capacitors may adequately charge to each Vgate level.

Some time (typically less than or equal to T2) after code_vref 688A has the value of 32h, switch 2 (SW2) opens in subsequent stage 2, thus maintaining the then-existing value of Vgate on capacitor 564. In turn, the bias point of M2 570 thereafter remains constant, and the value of Vreg2 also remains constant, as shown at 652A in FIG. 6A. Vreg2 652A remains constant even as the value of code_vref 688A increases, e.g., to 33h, and Vref, Vgate, and Vreg (of all the other subsequent stage outputs) increase.

A similar operation occurs during sequence 684 with respect to the Nth stage. Switch N (SWN) opens some time (shown being less than TN) after code_vref 688A has the value of A8h, thus maintaining a different then-existing value of Vgate on capacitor 568. As a result, the regulated voltage output of the Nth subsequent stage, VrefN 660A is maintained at a different level than Vreg2 652A, as shown in FIG. 6A. Sequence 686 illustrates code_vref 688A stepping through the final hex codes.

Embodiments of the present invention are not limited to the quantity of steps, number of code_vref values, or particular order associated with subsequent stages (for example, the Nth stage may open earlier and provide a lower regulated voltage, etc.). The values of code_vref 688A used in the operation example shown in FIG. 6A are for illustration purposes only, and switch operations of a subsequent stage may occur at any desired value of code_vref 688A, not just those described above, e.g., 32h and A8h respectively.

Figure 6B:
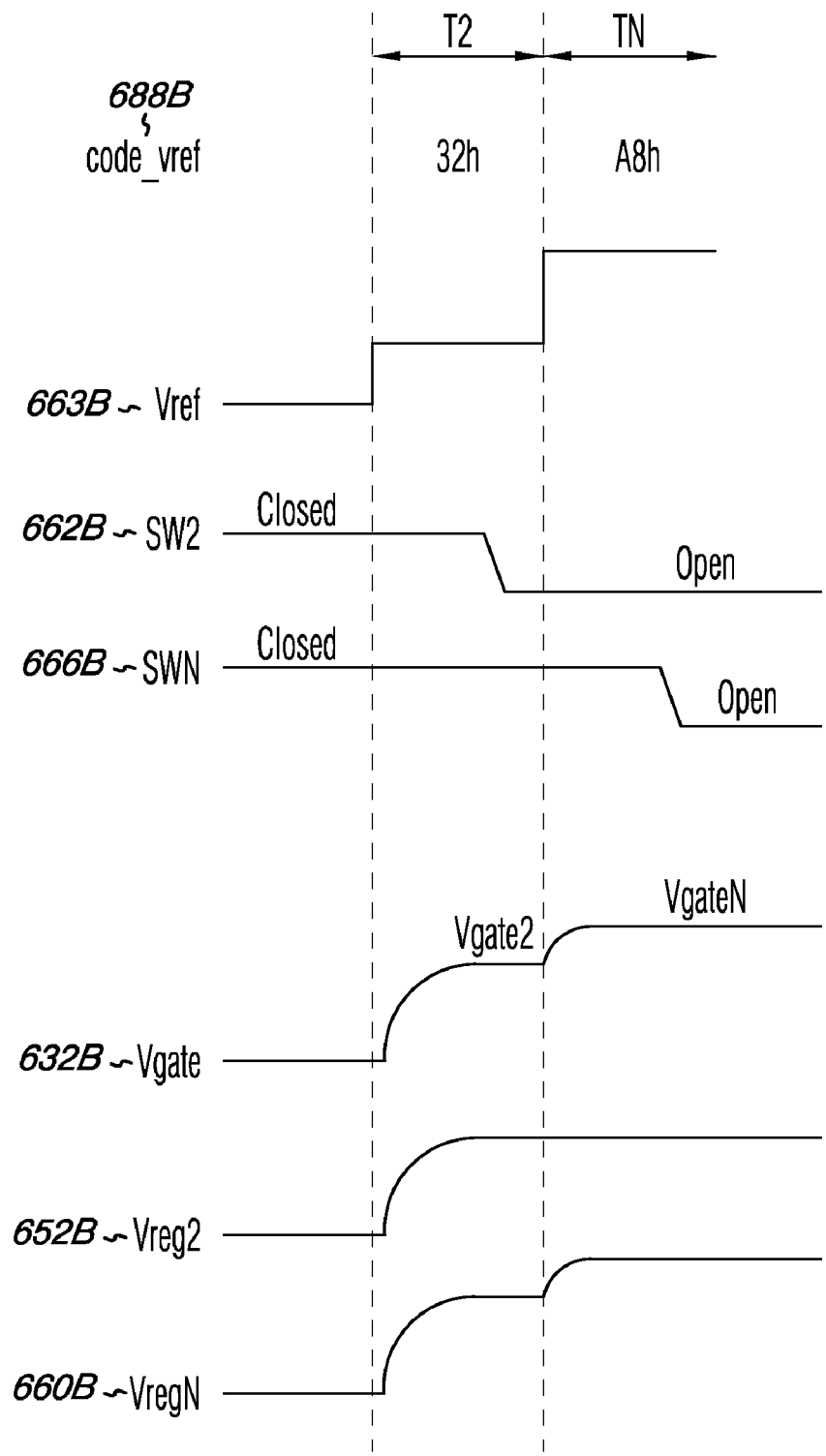
FIG. 6B shows timing waveforms associated with a voltage regulator system operated in a second mode in accordance with one or more embodiments of the present disclosure.

FIG. 6B shows timing waveforms associated with a voltage regulator system operated in a second mode in accordance with one or more embodiments of the present disclosure. As illustrated in FIG. 6A, code_vref 688A stepped through each digital value within a range of digital values, with the switches being configured to operate at particular code_vref 688A values, e.g., 32h and A8h respectively. As the reader will appreciate, there may be values of code_vref 688A at which no sample and hold switching occurs. Thus, according to one or more embodiments of the present disclosure, code_vref 688A values need not step through all values within a given range; instead, code_vref 688A values may be applied to the DAC (to produce a corresponding analog value of Vref), and to the subsequent stages (to control operation of the respective sample and hold switches) in a specific sequence, for example, only the values at which one stage will operate to maintain the then-existing value of Vgate at that value of code_vref 688A.

As is shown in FIG. 6B, code_vref 688A steps from a value of 32h (where stage 2 operates as described above with respect to FIG. 6A) to a value of A8h (where stage N operates as described above with respect to FIG. 6A). Corresponding to the relatively larger step change in code_vref 688A value, is a relatively larger step change in Vref (shown in FIG. 6B, but not shown in FIG. 6A). One skilled in the art will appreciate that with the relatively larger step change in voltages, Vgate must charge all the capacitors then coupled thereto, and so, due to the time constant of the sample and hold capacitor, the time, e.g., T2 for stage 2 and TN for stage N, may be longer for some code_vref 688A value changes than for others (depending on the magnitude of the corresponding change in Vgate). By stepping code_vref 688A between particular values, the reader will appreciate that some time, and wasted current draw, may be saved in operating the voltage regulator of the present disclosure.

Figure 6C:
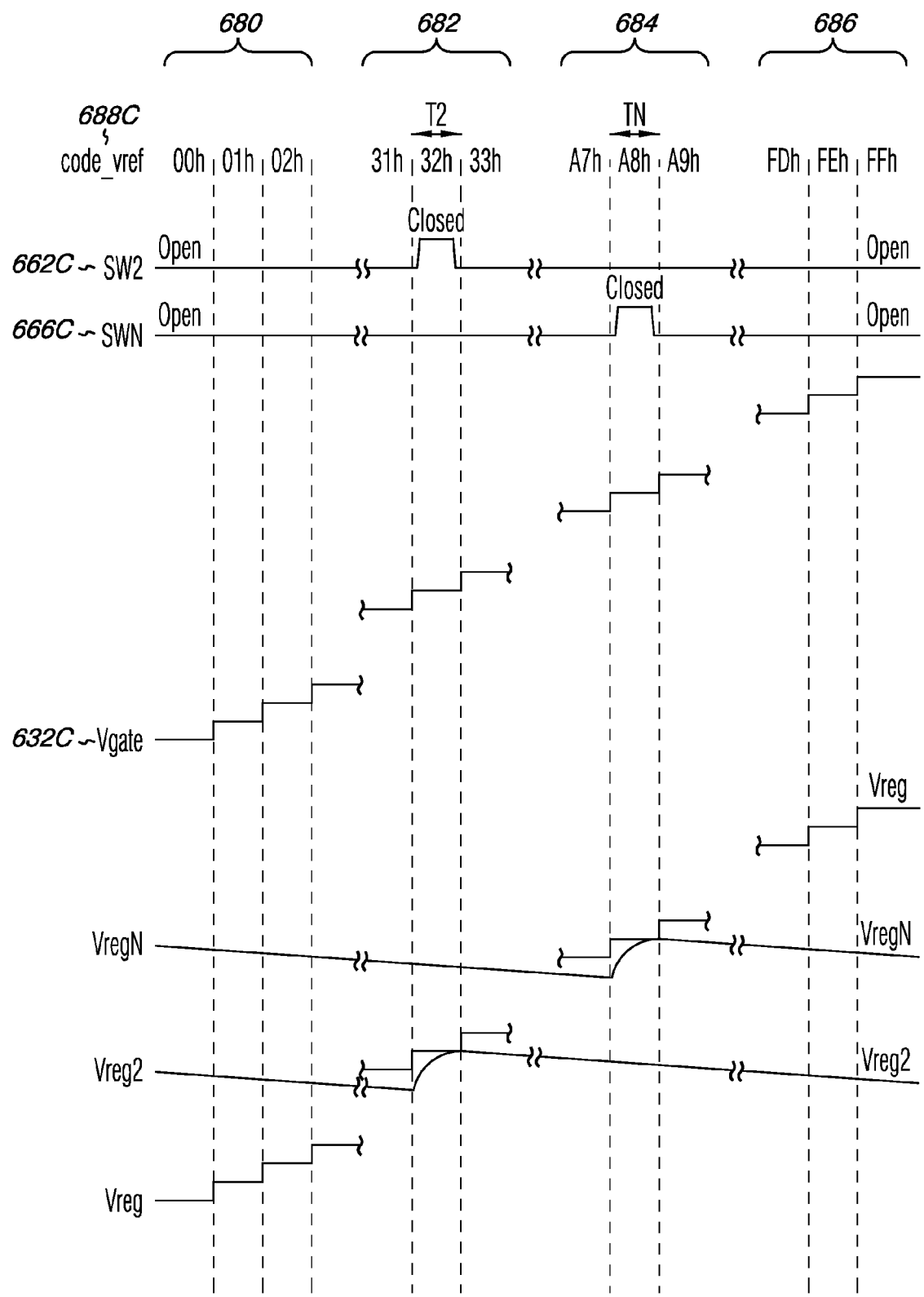
FIG. 6C shows timing waveforms associated with a voltage regulator system operated in a refresh mode in accordance with one or more embodiments of the present disclosure.

FIG. 6C shows timing waveforms associated with a voltage regulator system operated in a refresh mode in accordance with one or more embodiments of the present disclosure. The timing waveforms can be associated with the voltage regulator system described in FIGS. 4 and 5. As described above with respect to FIG. 6A, some time after code_vref 688A has the value of 32h, switch 2 (SW2) opens to maintain the then-existing value of Vgate on capacitor 564, and some time after code_vref 688A has the value of A8h, switch N (SWN) opens to maintain the then-existing value of Vgate on capacitor 568, thus holding the bias points of the respective n-channel MOS transistor, e.g., M2 (570) in the second stage and MN (574) in the Nth stage as shown in FIG. 5, constant. However, the voltage on the capacitors, e.g., 564 and 568, may discharge slowly, for example by leakage.

In order to keep the gate voltages of the load MOSFETs, e.g., M2 (570) in the second stage and MN (574) in the Nth stage as shown in FIG. 5, appropriately biased for extended periods of time, as system demands may dictate, the respective capacitor charge voltage may be periodically refreshed using a technique similar to that used to initially charge the respective capacitors, e.g., 564 and 568. Capacitor charge switches, e.g., SW2 (562) through SWN (566) are initially open, thereby holding the charge on the corresponding capacitors at the set voltages.

Referring now to FIG. 6C, code_vref (688C) can be incremented through a sequence of hexadecimal codes, for example from 00h to FFh. Some time after code_vref 688C reaches a value of 32h (i.e., during time T2), and Vreg and Vgate are substantially established at their respective corresponding levels, switch 2 (SW2) closes thereby allowing the charge on capacitor C2 (564) to be refreshed to the then-existing value of Vgate. Subsequently during time T2, while code_vref 688C still has the value of 32h, switch 2 (SW2) opens to isolate capacitor C2 (564) from Vgate. Thus, capacitor C2 (564) is left charged to the then-existing voltage level of Vgate, and Vreg2 652A remains constant even as the value of code_vref 688C subsequently changes.

By pulsing closed an appropriate switch during a period when Vgate is being held at a desired voltage, the voltage being held on capacitor C2 (564) may be refreshed back to the desired level, e.g., the value to which capacitor C2 (564) was initially charged. Depending on a number of variables (such as size of the capacitor, circuit time constant, amount of charge lost, etc.), the time needed to re-charge a respective capacitor back to the desired voltage may be small relative to the time to initially set capacitor voltages. Other capacitors, e.g., CN (568), may be periodically re-charged in a similar manner.

Figure 6D:
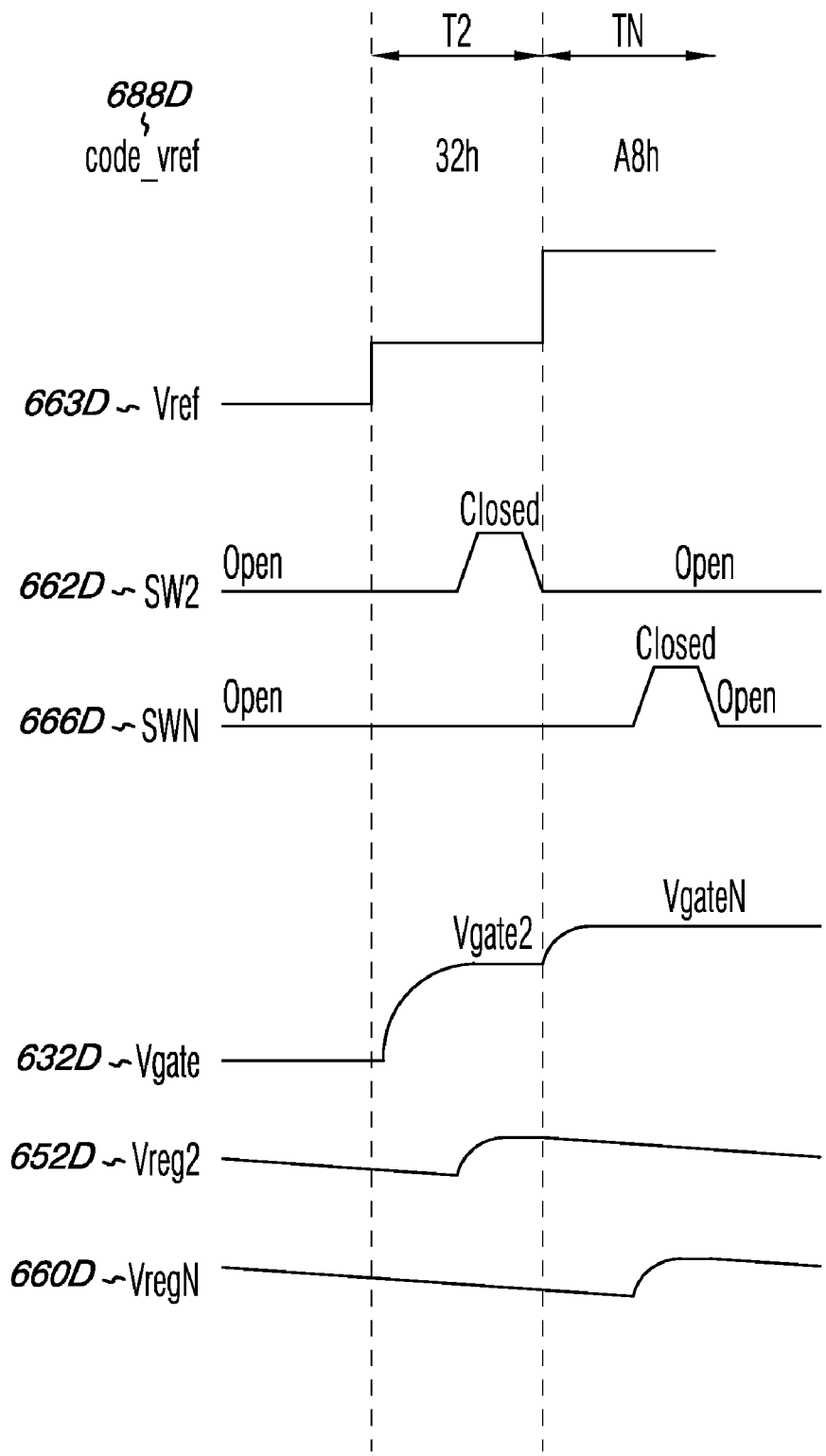
FIG. 6D shows timing waveforms associated with a voltage regulator system operated in another refresh mode in accordance with one or more embodiments of the present disclosure.

FIG. 6D shows timing waveforms associated with a voltage regulator system operated in another refresh mode in accordance with one or more embodiments of the present disclosure. Rather than progressing sequentially through all code values of code_vref (663C), as described above with respect to FIG. 6C, Vref 663D level may be changed from corresponding with one particular code, e.g., 32h, to corresponding with another particular code, e.g., A8h, as was previously described with respect to FIG. 6B. Each Vref 663D level produces a corresponding Vgate level, as was previously described with respect to FIG. 6B. Switches, e.g., SW2 ... SWN, may be operated as described above with respect to FIG. 6C. That is, a switch may be closed during a time when Vgate is substantially stable at a desired level corresponding to a desired regulated voltage, e.g., Vreg2 ... VregN. Although Vgate step changes may be relatively large by this technique, the changes to the regulated voltages are generally still relatively small during the re-charging since the initial voltage on the capacitor may have been very near the desired charged voltage level.

As can be seen from the waveforms in FIG. 6D, the capacitor charging switches, e.g., SW2 ... SWN, are closed after Vgate becomes substantially stable, thus some delay to allow Vgate to sufficiently change may be used. The step change between successive levels of Vgate may be greater than for the method illustrated in FIG. 6C, thus the time T2 may have to be greater, and the period when a particular switch is closed may have to be delayed somewhat from the change in Vref to allow the voltage level of Vgate to sufficiently stabilize at its new level. However, where fewer capacitors are connected to Vgate (because many, or all, switches are open during the refresh mode of operation) Vgate may change more quickly than is shown by waveform 632D.

One skilled in the art will also appreciate that a combination of initially charging certain capacitors, changing the voltage level of certain other capacitors, and refreshing the charge level of another one or more capacitors may all be accomplished during the same sweep sequence of code_vref (illustrated in FIG. 6C) or Vref (illustrated in FIG. 6D).

Figure 7:
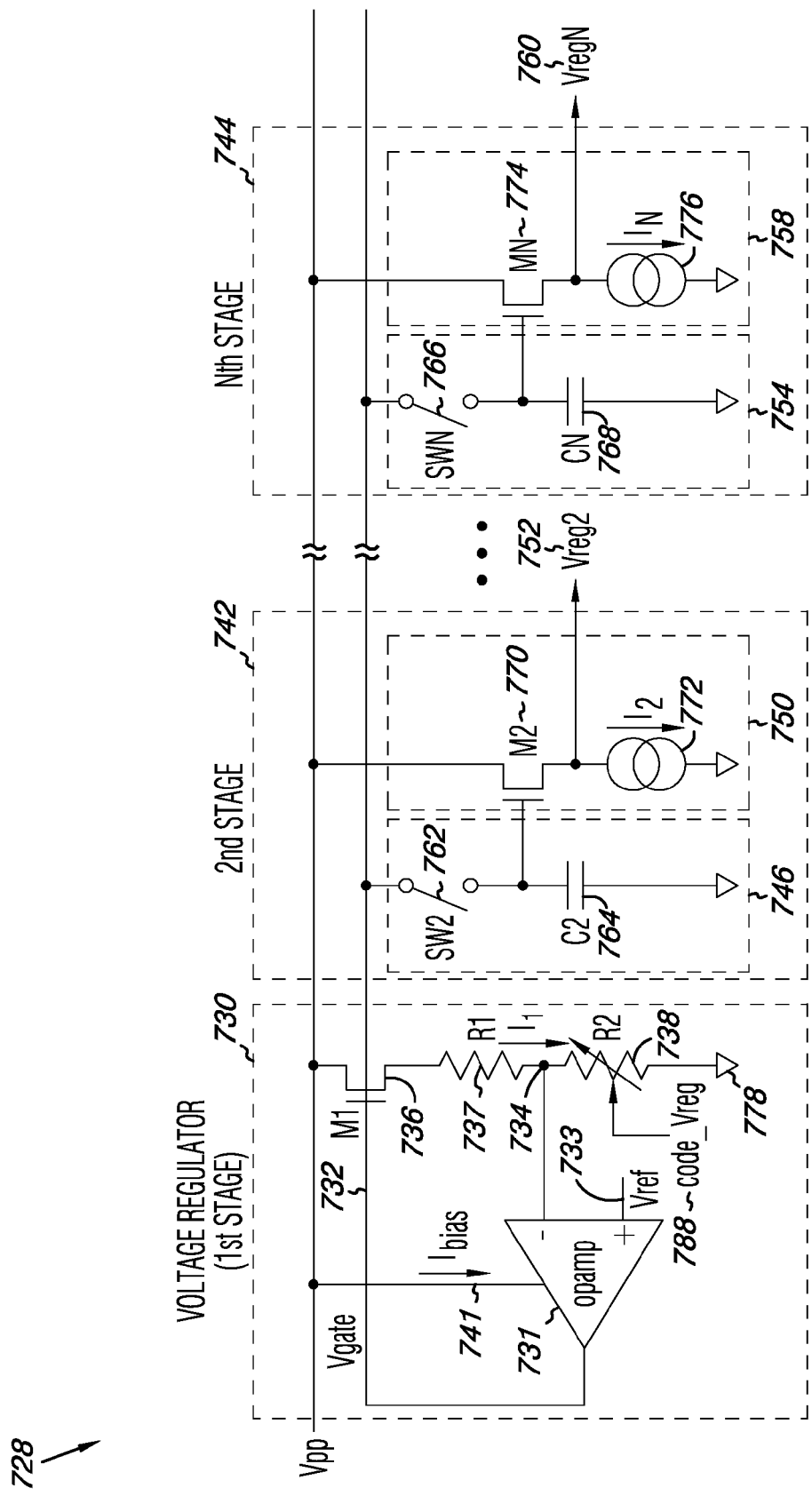
FIG. 7 is a circuit diagram of a voltage regulator system having a configurable resistive network in accordance with one or more embodiments of the present disclosure.
Figure 9A:
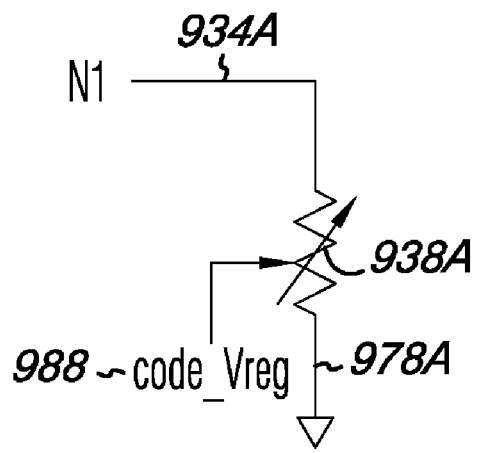
FIG. 9A is a circuit element symbol indicating a configurable resistance in accordance with one or more embodiments of the present disclosure.
Figure 9B:
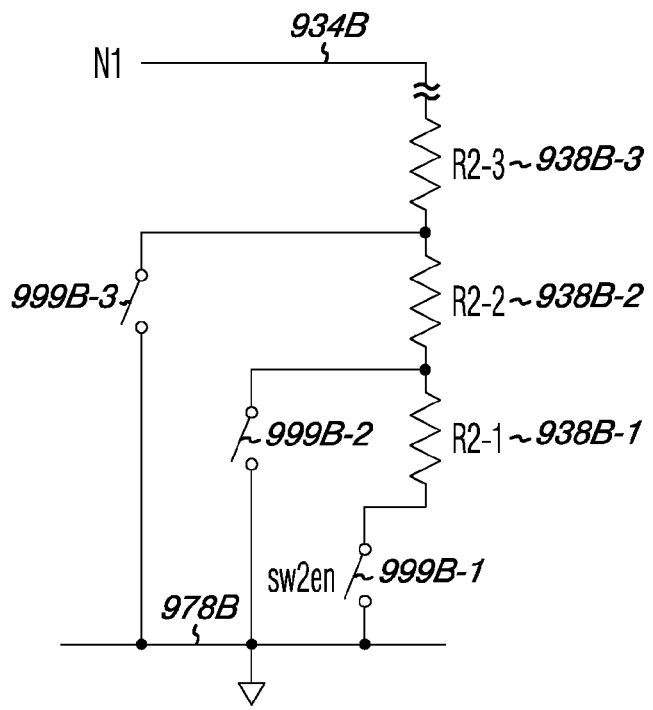
FIG. 9B is a circuit diagram of a first implementation of a configurable resistive network in accordance with one or more embodiments of the present disclosure.
Figure 9C:
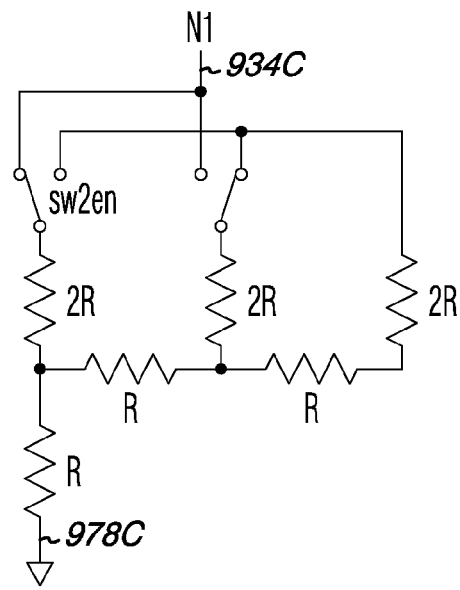
FIG. 9C is a circuit diagram of a second implementation of a configurable resistive network in accordance with one or more embodiments of the present disclosure.

FIG. 7 is a circuit diagram of a voltage regulator system having a configurable resistive network in accordance with one or more embodiments of the present disclosure. The configuration and operation of the voltage regulator system 728 shown in FIG. 7 is the same as for the voltage regulator system 528 shown in FIG. 5, and described in conjunction with the timing waveforms presented in FIGS. 6A and 6B, with the exceptions noted as follows. The resistive element R2 738 is shown as being variable, e.g., configurable, based on a digital value of code_vref 788. Several example implementations of a resistive network that is configurable in this manner are illustrated in FIGS. 9A-9C, and discussed further below.

As described above in regards to FIG. 3, Vgate is determined based on the difference (or "error") between the reference voltage, e.g., Vref, and the feedback voltage, e.g., from node 734 of the voltage divider network of the source follower circuit including resistive elements R1 and R2. Thus, Vgate may be varied by changing the input Vref signal, examples of which are described above. However, the difference (or "error") signal presented to the comparator 731, and Vgate derived therefrom, may also be varied by changing the feedback voltage, e.g., from node 734. Therefore, according to one or more embodiments, Vref remains fixed, e.g., steady, and the impedance value of R1 is modified to change the characteristics of the voltage divider network, and thereby adjust the feedback voltage level present at node 734. One skilled in the art will appreciate that, as described further below, the value of code_vref can be stepped as previously described, not to change Vref, but to similarly change Vgate, and provide thereafter the same operation of the voltage regulator system 728 as was described for voltage regulator system 528 with respect to FIGS. 5-6B.

Figure 8:
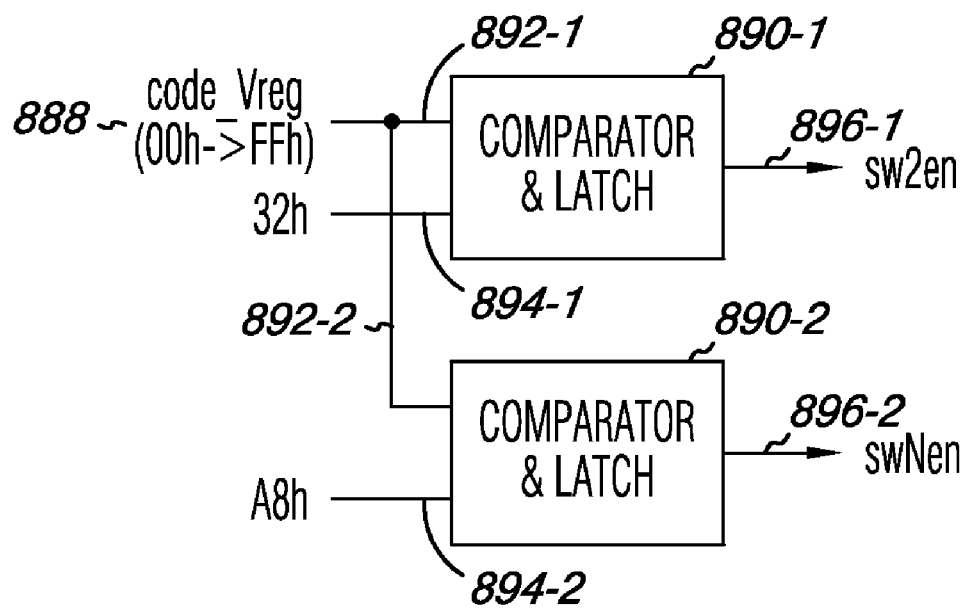
FIG. 8 is a block diagram of a comparator and latch circuit in accordance with one or more embodiments of the present disclosure.

FIG. 8 is a block diagram of a comparator and latch circuit in accordance with one or more embodiments of the present disclosure. FIGS. 6A and 6B described one sample and hold switch operating, e.g., opening/closing, for a particular value of a digital signal, e.g., code_vref, and another sample and hold switch operating, e.g., opening/closing, for another particular value of the digital signal. FIG. 8 illustrates one example implementation of these operations.

A comparator and latch circuit, e.g., 890-1, has two inputs. A changing digital signal is coupled to one input 892-1 of the comparator and latch, and a fixed value of the digital signal, e.g., 32h, is coupled to the other input 894-1 of the comparator and latch 890-1. The comparator and latch 890-1 compares the two inputs and latches a signal, e.g., switch 2 enable (sw2en), on an output 896-1 to one logic state, e.g., LOW, when the inputs do not match, and to another logic state, e.g., HIGH, when the inputs do match. The output 896-1 may be coupled to control switch 2 (sw2)of the sample and hold circuit of the second subsequent stage, e.g. 562 shown in FIG. 5.

Another comparator and latch circuit 890-2 is used to compare the changing digital signal, e.g., code_vref, to another threshold digital value, e.g., A8h, to control the sample and hold switch of another subsequent stage, e.g., 566 of stage N as shown in FIG. 5.

FIG. 9A is a circuit element symbol indicating a configurable resistance in accordance with one or more embodiments of the present disclosure. As shown in FIG. 7, resistive element R2 is coupled between the node of a voltage divider network, e.g., 734 and a common potential, e.g., signal ground. FIG. 9A illustrates a configurable resistance 938A having a first end for coupling to a node (N1) 934A, and a second end 978 for coupling to common potential, e.g., signal ground (as shown). The particular configuration of the configurable resistance 938A is determined by a digital signal input 988, e.g., code_vref.

FIG. 9B is a circuit diagram of a first implementation of a configurable resistive network in accordance with one or more embodiments of the present disclosure. FIG. 9B illustrates a number of resistors, e.g., 938B-1, 938B-2, 938B-3, connected in series between the node N1 934B and a common potential 978B, e.g., signal ground. Corresponding switches, e.g., R2-1 (999B-1), R2-2 (999B-2), and R2-3 (999B-3), control the position, e.g., conductivity, of whether each resistor is included in the total resistance between node N1 934B and a common potential 978B, e.g., signal ground. The logic signal to control each switch may be developed from a changing digital signal, e.g., code_vref as shown in FIG. 9A, according to the comparator and latch implementation shown in FIG. 8. The switches shown in FIG. 9B may be implemented as transistors, or other appropriate switching electronics or mechanisms.

FIG. 9C is a circuit diagram of a second implementation of a configurable resistive network in accordance with one or more embodiments of the present disclosure. FIG. 9C illustrates another, of many possible, configurable resistive network implementations, with the switches being similarly individually controlled by an input changing digital signal, e.g., code_vref, as described above.

Figure 10A:
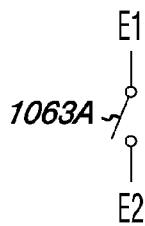
FIG. 10A is a circuit element symbol indicating a switch in accordance with one or more embodiments of the present disclosure.

FIG. 10A is a circuit element symbol indicating a switch in accordance with one or more embodiments of the present disclosure. The switch 1063A shown in FIG. 10A has a first end (E1) and a second end (E2), and may be implemented electronically in a number of ways, some of which are shown in FIGS. 10B and 10C below.

Figure 10B:
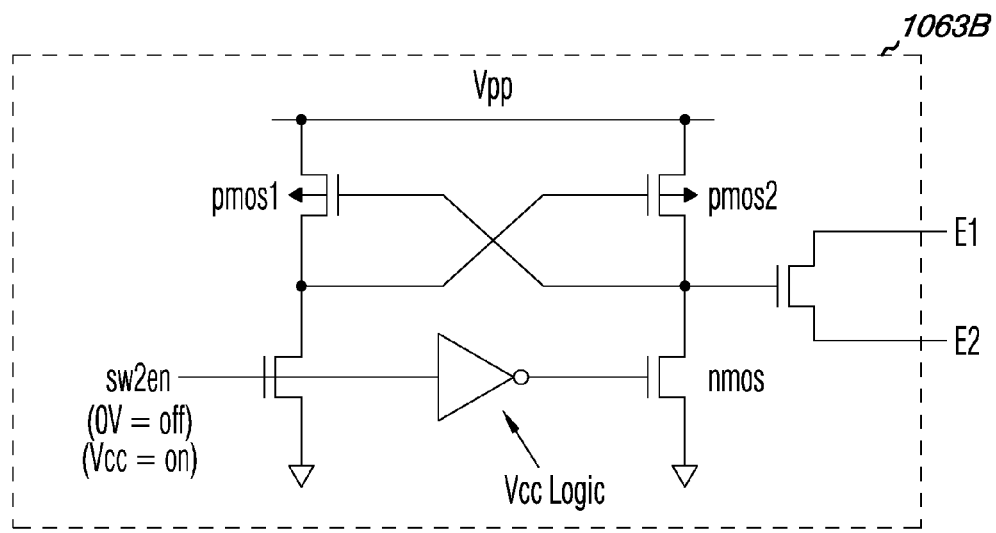
FIG. 10B is a circuit diagram of a first implementation of a switching circuit in accordance with one or more embodiments of the present disclosure.
Figure 10C:
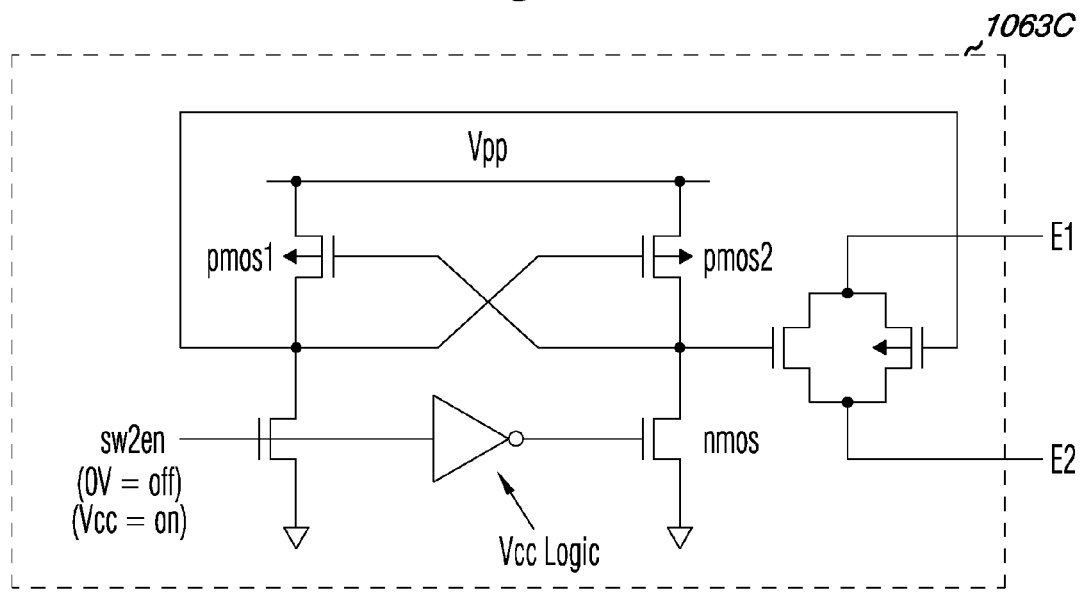
FIG. 10C is a circuit diagram of a second implementation of a switching circuit in accordance with one or more embodiments of the present disclosure.

FIG. 10B is a circuit diagram of a first implementation of a switching circuit in accordance with one or more embodiments of the present disclosure. Switch 1063B has a first end (E1) and a second end (E2). The logic signal, e.g., switch 2 enable (sw2en) to control each switch may be developed from a digital signal, e.g., code_vref, according to the comparator and latch implementation shown in FIG. 8. Note the sw2en signal is at Vcc logic levels with 0V indicating the switch 1063B should be open, e.g., non-conducting, and a Vcc logic level indicating the switch 1063B should be closed, e.g., conducting.

According to one or more embodiments, a signal line communicating the control logic signal (sw2en) is coupled to the gate of a first n-channel MOS transistor, and through an inverter, to the gate of a second n-channel MOS transistor, such that one or the other is on at any given logic level of the control logic signal (sw2en). When the control logic signal (sw2en) is HIGH, e.g., Vcc, the first (receiving the un-inverted control logic signal (sw2en)) n-channel MOS transistor is ON, thereby driving the gate voltage of p-channel MOS (pmos2) transistor LOW, turning on the p-channel MOS (pmos2) transistor and driving the gate voltage of the output transistor HIGH to cause it to conduct, e.g., turn on when the control logic signal (sw2en) is HIGH. With the control logic signal (sw2en) HIGH, e.g., Vcc, the second (receiving the inverted control logic signal (sw2en)) n-channel MOS transistor is OFF, as is the p-channel MOS (pmos1) transistor.

Conversely, when the control logic signal (sw2en) signal is LOW, e.g., 0 volts, the second (receiving the inverted control logic signal (sw2en)) n-channel MOS transistor is ON, thereby driving the gate voltage of p-channel MOS (pmos1) transistor LOW, turning on the p-channel MOS (pmos1) transistor. The first (receiving the un-inverted control logic signal (sw2en)) n-channel MOS transistor is OFF, so that the gate of the p-channel MOS (pmos2) transistor is HIGH, thereby turning OFF the p-channel MOS (pmos2) transistor. Thus, the gate of the output transistor is LOW, and the output transistor does not conduct, e.g., is turned off, when control logic signal (sw2en) is LOW.

FIG. 10C is a circuit diagram of a second implementation of a switching circuit in accordance with one or more embodiments of the present disclosure. Switch 1063C has a first end (E1) and a second end (E2). The logic signal, e.g., switch 2 enable (sw2en) to control each switch may be developed from a changing digital signal, e.g., code_vref, according to the comparator and latch implementation shown in FIG. 8. According to one or more embodiments, the control logic signal (sw2en) is coupled to the gate of an n-channel MOS transistor, with 0V indicating the switch 1063C should be open, e.g., non-conducting, and a Vcc logic level indicating the switch 1063C should be closed, e.g., conducting.

Operation of the switch circuit illustrated in FIG. 10C is similar to that described above with respect to the switch circuit illustrated in FIG. 10B, with the addition of a p-channel MOS output transistor in parallel with the n-channel MOS output transistor. The gate of the p-channel MOS output transistor is biased opposite to that of the n-channel MOS output transistor. One skilled in the art will recognize the faster switching speed that may be obtained from this arrangement.

Figure 11:
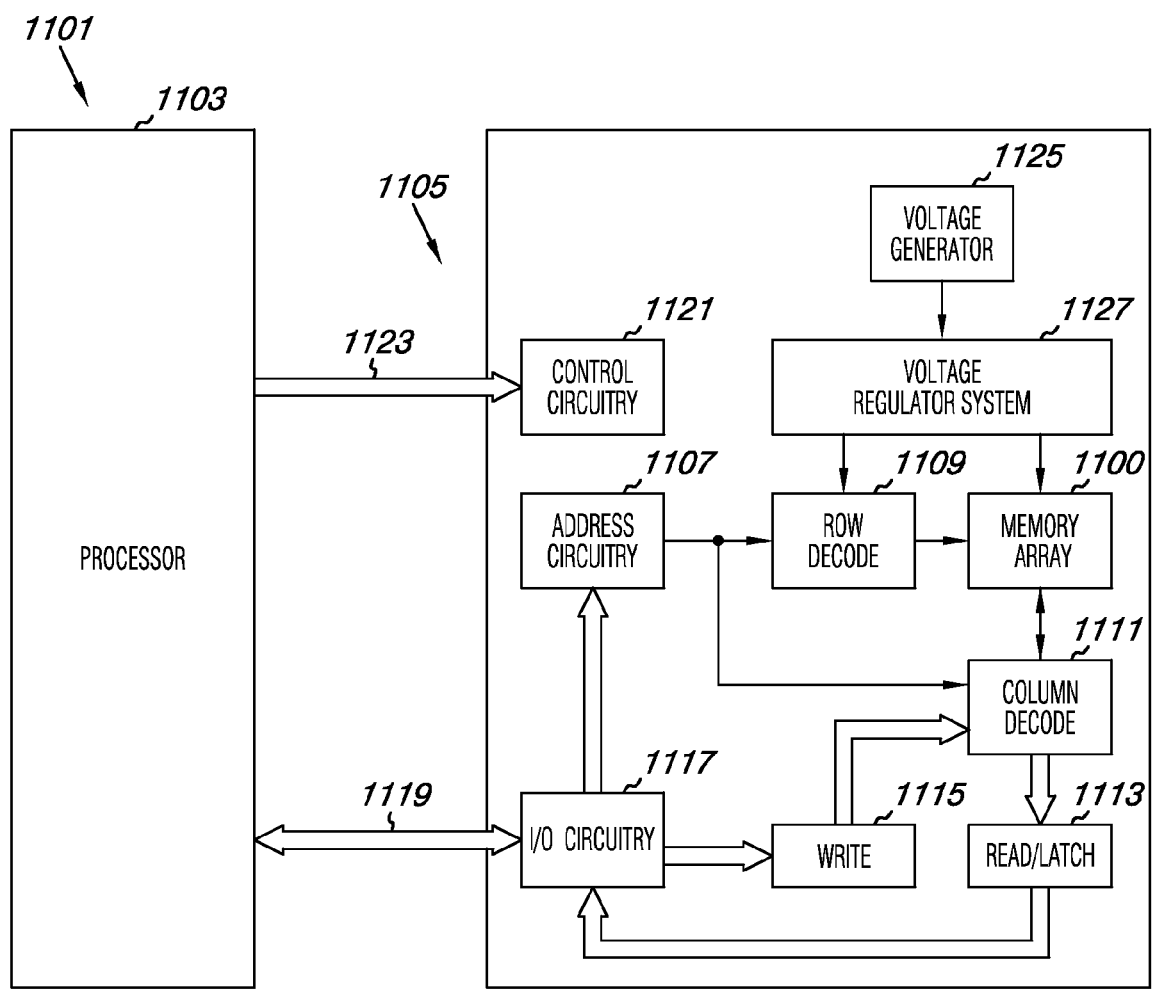
FIG. 11 is a functional block diagram of an electronic memory system having at least one memory device operated in accordance with one or more embodiments of the present disclosure.

FIG. 11 is a functional block diagram of an electronic memory system having at least one memory device operated in accordance with one or more embodiments of the present disclosure. Memory system 1101 includes a processor 1103 coupled to a non-volatile memory device 1105 that includes a memory array 1100 of non-volatile memory cells. The memory system 1101 can include separate integrated circuits or both the processor 1103 and the memory device 1105 can be on the same integrated circuit. The processor 1103 can be a microprocessor or some other type of controlling circuitry such as an application-specific integrated circuit (ASIC).

The memory device 1105 includes an array of non-volatile memory cells 1100, which can be floating gate flash memory cells with a NAND architecture, for example. The control gates of memory cells of a "row" are coupled with a access line, while the drain regions of the memory cells of a "column" are coupled to data lines. The source regions of the memory cells are coupled to source lines, as the same has been illustrated in FIG. 1. As will be appreciated by those of ordinary skill in the art, the manner of connection of the memory cells to the data lines and source lines depends on whether the array is a NAND architecture, a NOR architecture, an AND architecture, or some other memory array architecture.

The embodiment of FIG. 11 includes address circuitry 1107 to latch address signals provided over I/O connections 1119 through I/O control circuitry 1117. Address signals are received and decoded by a row decoder 1109 and a column decoder 1111 to access the memory array 1100. In light of the present disclosure, it will be appreciated by those skilled in the art that the number of address input connections depends on the density and architecture of the memory array 1100 and that the number of addresses increases with both increased numbers of memory cells and increased numbers of memory blocks and arrays.

A voltage generator 1125 may supply a voltage to a voltage regulator system 1127, which in turn provides one or more regulated voltages to the memory array 1100 and/or row decoder 1109, for example. The memory device 1105 senses data in the memory array 1100 by sensing voltage and/or current changes in the memory array columns using sense/buffer circuitry that in this embodiment can be read/latch circuitry 1113. The read/latch circuitry 1113 can read and latch a page, e.g., a row, of data from the memory array 1100. I/O control circuitry 1117 is included for bi-directional data communication over the I/O connections 1119 with the processor 1103. Write circuitry 1115 is included to write data to the memory array 1100.

Control logic circuitry 1121 decodes signals provided by control connections 1123 from the processor 1103. These signals can include chip signals, write enable signals, and address latch signals (among others) that are used to control the operations on the memory array 1100, including data sensing, data write, and data erase operations. The control logic circuitry 1121 can send signals, e.g., commands, to selectively reset particular registers and/or sections of registers according to one or more embodiments of the present disclosure. In one or more embodiments, the control logic circuitry 1121 is responsible for executing instructions from the processor 1103 to perform the operations according to embodiments of the present disclosure. The control logic circuitry 1121 can be a state machine, a sequencer, or some other type of controller. It will be appreciated by those skilled in the art that additional circuitry and control signals can be provided, and that the memory device detail of FIG. 11 has been reduced to facilitate ease of illustration.

The processor 1103 performs various computing functions, such as executing specific software to perform specific calculations or tasks. In addition, electronic memory system 1101 may include one or more input devices (not shown), such as a keyboard and/or pointing device, coupled to the processor 1103 to allow an operator to interface with the processor 1103. Typically, the electronic memory system 1101 may also include one or more output devices (not shown) coupled to the processor 1103, such output devices typically being, for example, a display and/or printing device.

One or more data storage devices (not shown) may also typically be coupled to the processor 1103 to store data or retrieve data. Examples of storage devices include hard disks and removable non-volatile memory. The electronic memory system 1101 may also include a communication link (not shown) through which the processor 1103 can send and receive data, such as to a network. For example, the communication link may be a wireless communication link configured to communicate with the network through a wireless medium. The processor 1103 is typically coupled to the data storage devices through an appropriate interface (not shown), the interface including address, data, and control busses to provide for writing data to, and reading data from, the data storage devices.

CONCLUSION

The present disclosure includes circuits, systems and methods for regulating voltage. One voltage regulator system embodiment includes a voltage regulator having an output and a number of stages coupled in parallel to the output of the voltage regulator. Each stage includes a source follower circuit, and a sample and hold circuit coupled in series between the output of the voltage regulator and an input of the source follower circuit.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment

What is claimed is:

1. A voltage regulator system, comprising:
    a voltage regulator configured to monitor a difference of signal proportional to a voltage source with respect to a reference voltage signal, and having an output; and
    a plurality of stages coupled in parallel to the output of the voltage regulator, each stage including:
        a source follower circuit including a MOS transistor directly coupled in series between the voltage source and a regulated voltage output; and
        a sample and hold circuit directly coupled in series between the output of the voltage regulator and an input of the source follower circuit,
    wherein the voltage source is a pumped programming voltage provided by a charge pump from a supply voltage.

2. The voltage regulator system of claim 1, wherein the number of stages is at least two.

3. The voltage regulator system of claim 2, wherein the sample and hold circuit of each of the number of stages is operable to hold a different voltage regulator output voltage as an input to an associated source follower circuit.

4. The voltage regulator system of claim 3, wherein each sample and hold circuit includes a switch coupled in series with a capacitor between the output of the voltage regulator and a common potential, the input to the associated source follower circuit coupled to a node between the switch and the capacitor.

5. The voltage regulator system of claim 4, wherein the switch of one of the number of stages opens at a different time than the switch of another stage of the number of stages.

6. The voltage regulator system of claim 1, wherein the voltage regulator includes comparator and a voltage follower circuit.

7. The voltage regulator system of claim 6, wherein the voltage follower circuit has a MOS transistor coupled in series with a first resistive element and a second resistive element between a source potential and a common potential, and where a first input terminal of the comparator is coupled to a reference voltage signal line, and a second input terminal of the comparator is coupled to a node between the first and second resistive elements, and where the output of the comparator is coupled to a gate of the MOS transistor.

8. The voltage regulator system of claim 6, wherein the switch of one of the number of stages opens corresponding to a first value present on the reference voltage signal line, and the switch of another stage of the number of stages opens corresponding to a second value present on the reference voltage signal line.

9. The voltage regulator system of claim 6, wherein the reference voltage signal line is coupled to an output of a digital-to-analog converter receiving a input digital signal, and wherein the switch of one of the number of stages opens corresponding to a first input digital signal value, and the switch of another stage of the number of stages opens corresponding to a second input digital signal value.

10. The voltage regulator system of claim 6, wherein second resistive element is a configurable resistive network.

11. The voltage regulator system of claim 10, wherein a particular resistance of the configurable resistive network is selected corresponding to an input digital signal, and wherein the switch of a first stage opens corresponding to a first input digital signal, and the switch of a second stage opens corresponding to a second input digital signal.

12. A voltage regulator system, comprising:
a voltage regulator, the voltage regulator including:
a comparator,
a MOS transistor having a drain coupled to a voltage source;
a first resistive element having a first terminal coupled to a source of the MOS transistor;
a second resistive element having a first terminal coupled to a second terminal of the first resistive element, and a second terminal coupled to a common potential plane; and where a first input terminal of the comparator is coupled to a reference voltage signal line, and a second input terminal of the comparator is coupled to a node between the first and second resistive elements, and where the output of the comparator is coupled to the gate of the MOS transistor;
a first sample and hold circuit having an input coupled to the output of the comparator;
a first source follower circuit having an input coupled to the output of the first sample and hold circuit;
a plurality of sample and hold circuits, each having an input coupled to the output of the comparator; and
a source follower circuit corresponding to each of the plurality of sample and hold circuits, the source follower circuit having an input coupled to the output of the corresponding sample and hold circuit.

13. The voltage regulator system of claim 12, further comprising:
a second sample and hold circuit having an input coupled to the output of the comparator; and
a second source follower circuit having an input coupled to the output of the second sample and hold circuit.

14. The voltage regulator system of claim 13, wherein the sample and hold circuits each include a switch coupled in series with a capacitor between the output of the comparator and the common potential plane, the input to the corresponding source follower circuit coupled to a node between the switch and the capacitor.

15. The voltage regulator system of claim 14, wherein the source follower circuits includes a second MOS transistor having a drain coupled to the voltage source, a source coupled to a current source, and a gate coupled to a node between the switch and the capacitor of the corresponding sample and hold circuit.

16. The voltage regulator system of claim 14, wherein the second resistive element is a configurable resistive network.

17. The voltage regulator system of claim 16, wherein a configuration of the configurable resistive network, and the continuity of each of the switches, is selected based on a digital logic signal.

18. A method of voltage regulation, comprising:
generating a gate voltage signal based on a difference between a reference voltage signal and a signal proportional to a voltage source;
changing the reference voltage signal;
storing a first gate voltage signal magnitude;
storing a second gate voltage signal magnitude after changing the reference voltage signal;
biasing a first source follower input with the stored first gate voltage magnitude, and a second source follower input with the stored second gate voltage magnitude; and
providing simultaneously a first voltage regulator output from the first source follower and a second voltage regulator output from the second source follower,
wherein the first voltage regulator output has a different magnitude than the second voltage regulator output.

19. The method of claim 18, wherein:
storing the first gate voltage magnitude includes charging a first capacitor to the first gate voltage magnitude, then isolating the first capacitor from the first gate voltage magnitude; and
storing the second gate voltage magnitude includes charging a second capacitor to the second gate voltage magnitude, then isolating the second capacitor from the second gate voltage magnitude.

20. The method of claim 19, wherein:
the first capacitor is isolated from the gate voltage signal except during a period when the gate voltage signal substantially equals the first gate voltage magnitude; and
the second capacitor is isolated from the gate voltage signal except during a period when the gate voltage signal substantially equals the second gate voltage magnitude.

21. The method of claim 18, wherein:
storing the first gate voltage magnitude includes charging a first capacitor at the first gate voltage magnitude and isolating the first capacitor from the second gate voltage magnitude; and
storing the second gate voltage magnitude includes charging a second capacitor at the second gate voltage magnitude and isolating the second capacitor from the first gate voltage magnitude.

22. The method of claim 18, wherein changing the reference voltage signal includes ramping reference voltage signal from one analog value to another, and wherein isolating the first and second capacitors includes opening a switch.

* * * * *

UNITED STATES PATENT AND TRADEMARK OFFICE
CERTIFICATE OF CORRECTION

| | |
|---|---|
| PATENT NO. | : 8,026,702 B2 |
| APPLICATION NO. | : 12/200457 |
| DATED | : September 27, 2011 |
| INVENTOR(S) | : Toru Tanzawa |

It is certified that error appears in the above-identified patent and that said Letters Patent is hereby corrected as shown below:

In column 20, line 2, in Claim 15, delete "includes" and insert -- each include --, therefor.

Signed and Sealed this
Twentieth Day of December, 2011

David J. Kappos
*Director of the United States Patent and Trademark Office*